(12) United States Patent
Berger et al.

(10) Patent No.: US 7,045,268 B2
(45) Date of Patent: *May 16, 2006

(54) POLYMERS BLENDS AND THEIR USE IN PHOTORESIST COMPOSITIONS FOR MICROLITHOGRAPHY

(75) Inventors: Larry L. Berger, Chadds Ford, PA (US); Frank L. Schadt, III, Wilmington, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 111 days.

This patent is subject to a terminal disclaimer.

(21) Appl. No.: 10/398,871

(22) PCT Filed: Nov. 21, 2001

(86) PCT No.: PCT/US01/43398

§ 371 (c)(1),
(2), (4) Date: Apr. 9, 2003

(87) PCT Pub. No.: WO02/44811

PCT Pub. Date: Jun. 6, 2002

(65) Prior Publication Data
US 2004/0137360 A1    Jul. 15, 2004

Related U.S. Application Data

(60) Provisional application No. 60/253,913, filed on Nov. 29, 2000.

(51) Int. Cl.
*G03F 7/004* (2006.01)
(52) U.S. Cl. .................. 430/270.1; 430/317; 430/323; 430/905; 430/907; 430/910
(58) Field of Classification Search ............ 430/270.1, 430/905, 907, 910, 317, 323
See application file for complete search history.

(56) References Cited

U.S. PATENT DOCUMENTS

| 3,444,148 | A | | 5/1969 | Adelman |
| 4,963,471 | A | | 10/1990 | Trout et al. |
| 5,177,166 | A | | 1/1993 | Kobo et al. |
| 5,229,473 | A | | 7/1993 | Kobo et al. |
| 5,655,627 | A | | 8/1997 | Horne et al. |
| 5,677,405 | A | | 10/1997 | Goodall et al. |
| 6,306,560 | B1 | * | 10/2001 | Wang et al. ............... 430/316 |
| 6,461,791 | B1 | * | 10/2002 | Hatakeyama et al. .... 430/270.1 |
| 6,503,686 | B1 | * | 1/2003 | Fryd et al. ............... 430/270.1 |
| 6,764,809 | B1 | * | 7/2004 | DeSimone et al. ......... 430/313 |

FOREIGN PATENT DOCUMENTS

| EP | 1024406 | 8/2000 |
| WO | WO 9733198 | 9/1997 |
| WO | WO 9856837 | 12/1998 |
| WO | WO 0017712 | 3/2000 |
| WO | WO 0025178 | 5/2000 |
| WO | WO 0067072 | 11/2000 |

OTHER PUBLICATIONS

JP03281664 Abstract.
JP62186907 Abstract.
Introduction to Microlithography, Second Edition by L. F. Thompson, C.G.Willson, and M. J. Bowden, American Chemical Society, Washington, DC 1994.
F. M. Houlihan et al., Macromolecules, 30, pp. 6517-6534, 1997.
T. Wallow et al., SPIE. vol. 2724, pp. 355-364.
F. M. Houlihan et al., Journal of Photopolymer Science and Technology, 10, No. 3, pp. 511-520.
Okoroanyanwu et al., SPIE, vol. 3049, pp. 92-103.
R. Allen et al., SPIE, vol. 2724, pp. 334-343 "Protecting Groups for 193-nm Photoresists".
Semiconductor International, Sep. 1997, p. 74-80.
J. Niu and J. Frechet, Angew, Chem. Int. Ed., 37, No. 5, 1998, pp. 667-670.
"Synthesis and Evaluation of Alicyclic Backbone Polymers for 193 nm Lithography", Chapter 16, ACS Symposium Series 706 (Micro-and Nanopatterning Polymers, pp. 208-223, 1998.
H. Ito et al., Abstract in Polymeric Materials Science and Engineering Division, American Chemical Society Meeting, vol. 77, Fall Meeting, Sep. 8-11, 1997, Las Vegas, NV.
K. J. Przybilla et al., "Hexafluoroacetone in Resist Chemistry: A Versatile New Concept for Materials for Deep UV Lithography", SPIE vol. 1672, 1992, p. 500-512.

* cited by examiner

*Primary Examiner*—John S. Chu

(57) ABSTRACT

A photoresist composition having (A) at least two polymers selected from the group consisting of: (a) a fluorine-containing copolymer comprising a repeat unit derived from at least one ethylenically unsaturated compound characterized in that at least one ethylenically unsaturated compound is polycyclic; (b) a branched polymer containing protected acid groups, said polymer comprising one or more branch segment(s) chemically linked along a linear backbone segment; (c) fluoropolymers having at least one fluoroalcohol group having the structure: —C(Rf)(Rf')OH wherein Rf and Rf' are the same or different fluoroalkyl groups of from 1 to about 10 carbon atoms or taken together are $(CF_2)_n$ wherein n is 2 to 10;(d) amorphous vinyl homopolymers of perfluoro (2,2-dimethyl-1,3-dioxole or $CX_2=CY_2$ where X=F or $CF_3$ and Y=H or amorphous vinyl copolymers of perfluoro (2,2-dimethyl-1,3-dioxole) and $CX_2=CY_2$; and (e) nitrile/fluoroalcohol-containing polymers prepared from substituted or unsubstituted vinyl ethers; and (B) at least one photoactive component.

16 Claims, No Drawings

POLYMERS BLENDS AND THEIR USE IN PHOTORESIST COMPOSITIONS FOR MICROLITHOGRAPHY

This application claims the benefit of U.S. Provisional No. 60/253,913 filed on Nov. 29, 2000.

FIELD OF THE INVENTION

The present invention pertains to photoimaging and, in particular, the use of photoresists (positive-working and/or negative-working) for imaging in the production of semiconductor devices. The present invention also pertains to blends of polymer compositions having high UV transparency (particularly at short wavelengths, e.g., 157 nm) which are useful as base resins in resists and potentially in many other applications.

BACKGROUND OF THE INVENTION

Polymer products are used as components of imaging and photosensitive systems and particularly in photoimaging systems such as those described in *Introduction to Microlithography, Second Edition* by L. F. Thompson, C. G. Willson, and M. J. Bowden, American Chemical Society, Washington, D.C., 1994. In such systems, ultraviolet (UV) light or other electromagnetic radiation impinges on a material containing a photoactive component to induce a physical or chemical change in that material. A useful or latent image is thereby produced which can be processed into a useful image for semiconductor device fabrication.

Although the polymer product itself may be photoactive, generally a photosensitive composition contains one or more photoactive components in addition to the polymer product. Upon exposure to electromagnetic radiation (e.g., UV light), the photoactive component acts to change the Theological state, solubility, surface characteristics, refractive index, color, electromagnetic characteristics or other such physical or chemical characteristics of the photosensitive composition as described in the Thompson et al. publication supra.

For imaging very fine features at the submicron level in semiconductor devices, electromagnetic radiation in the far or extreme ultraviolet (UV) is needed. Positive working resists generally are utilized for semiconductor manufacture. Lithography in the UV at 365 nm (I-line) using novolak polymers and diazonaphthoquinones as dissolution inhibitors is a currently established chip technology having a resolution limit of about 0.35–0.30 micron. Lithography in the far UV at 248 nm using p-hydroxystyrene polymers is known and has a resolution limit of 0.35–0.18 nm. There is strong impetus for future photolithography at even shorter wavelengths, due to a decreasing lower resolution limit with decreasing wavelength (i.e., a resolution limit of 0.18–0.12 micron for 193 nm imaging and a resolution limit of about 0.07 micron for 157 nm imaging). Photolithography using 193 nm exposure wavelength (obtained from an argon fluorine (ArF) excimer laser) is a leading candidate for future microelectronics fabrication using 0.18 and 0.13 μm design rules. Photolithography using 157 nm exposure wavelength (obtained from a fluorine excimer laser) is a leading candidate for future microlithography further out on the time horizon (beyond 193 nm) provided suitable materials can be found having sufficient transparency and other required properties at this very short wavelength. The opacity of traditional near UV and far UV organic photoresists at 193 nm or shorter wavelengths precludes their use in single-layer schemes at these short wavelengths.

Some resist compositions suitable for imaging at 193 nm are known. For example, photoresist compositions comprising cycloolefinmaleic anhydride alternating copolymers have been shown to be useful for imaging of semiconductors at 193 nm (see F. M. Houlihan et al, *Macromolecules*, 30, pages 6517–6534 (1997); T. Wallow et al., *SPIE*, Vol. 2724, pages 355–364; and F. M. Houlihan et al., *Journal of Photopolymer Science and Technology*, 10, No. 3, pages 511–520 (1997)). Several publications are focused on 193 nm resists (i.e., U. Okoroanyanwu et al, *SPIE*, Vol. 3049, pages 92–103; R. Allen et al., *SPIE*, Vol. 2724, pages 334–343; and *Semiconductor International*, September 1997, pages 74–80). Compositions comprising addition polymers and/or ROMP (ring-opening methathesis polymerization) of functionalized norbornenes have been disclosed (e.g., PCT WO 97/33198 (9/12197) to B. F. Goodrich). Homopolymers and maleic anhydride copolymers of norbornadiene and their use in 193 nm lithography have been disclosed (J. Niu and J. Frechet, Angew. *Chem. Int. Ed.*, 37, No. 5, (1998), pages 667–670). Copolymers of flourinated alcohol-substituted polycyclic etylenically unsaturated comonomer and sulfur dioxide that are suitable for 193 nm lithography have been reported (see H. Ito et al., "Synthesis and Evaluation of Alicyclic Backbone Polymers for 193 nm Lithography", Chapter 16, ACS Symposium Series 706 (Micro- and Nanopatterning Polymers) pages 208–223 (1998), and H. Ito et al., Abstract in Polymeric Materials Science and Engineering Division, American Chemical Society Meeting, Volume 77, Fall Meeting, Sep. 8–11, 1997, held in Las Vegas, Nev.) Because of the presence of repeat units derived from sulfur dioxide in this alternating copolymer, it is not suitable for 157 nm lithography due to the excessively high absorption coefficient of this polymer at 157 nm.

Photoresists containing fluorinated alcohol functional groups attached to aromatic moieties have been disclosed (see K. J. Przybilla et al., "Hexafluoroacetone in Resist Chemistry: A Versatile New Concept for Materials for Deep UV Lithography", *SPIE* Vol. 1672, (1992), pages 500–512). While suitable for 248 nm lithography, these resists, because of the aromatic functionality contained in them, are unsuitable for lithography at 193 or 157 nm (due to the excessively high absorption coefficients of the aromatic resist components at these wavelengths).

Copolymers of fluoroolefin monomers and cyclic unsaturated monomers are known (U.S. Pat. Nos. 5,177,166 and 5,229,473 to Daikin Industries, Ltd.). These patents do not disclose the use of these copolymers in any photosensitive compositions. Copolymers of certain fluorinated olefins with certain vinyl esters are known. For example, the copolymer of TFE with cyclohexanecarboxylate, vinyl ester is known (Japanese Patent Appl. JP 03281664 to Dainippon Ink and Chemicals). Copolymers of TFE and vinyl esters, such as vinyl acetate, and use of these copolymers in photosensitive compositions for refractive index imaging (e.g., holography) is known (U.S. Pat. No. 4,963,471 to DuPont).

Copolymers of norbornene-type monomers containing functional groups with ethylene have been disclosed previously (WO/56837 to B. F. Goodrich), as have copolymers of norbornene-type monomers containing functional groups with vinyl ethers, dienes, and isobutylene (U.S. Pat. No. 5,677,405 to B. F. Goodrich).

Certain copolymers of fluorinated alcohol comonomers with other comonomers have been reported in U.S. Pat. No. 3,444,148 and JP 62186907 A2 patent publication. These patents are directed to membrane or other non-photosensitve films or fibers, and neither has any teaching of fluorinated alcohol comonomers use in photosensitve layers (e.g., resists).

U.S. Pat. No. 5,655,627 discloses a process for generating a negative tone resist image by coating a silicon wafer with a copolymer resist solution of pentafluoropropyl methacrylate-t-butyl methacrylate in a solvent, and then exposing at 193 nm and developing with a carbon dioxide critical fluid.

A need still exists for resist compositions that satisfy the myriad of requirements for single layer photoresists that include optical transparency at 193 nm and/or 157 nm, plasma etch resistance, and solubility in an aqueous base developer.

SUMMARY OF THE INVENTION

In a first aspect, the invention provides a photoresist composition comprising:
- (A) at least two polymers selected from the group consisting of:
  - (a) a fluorine-containing copolymer comprising a repeat unit derived from at least one ethylenically unsaturated compound characterized in that at least one ethylenically unsaturated compound is polycyclic;
  - (b) a branched polymer containing protected acid groups, said polymer comprising one or more branch segment(s) chemically linked along a linear backbone segment;
  - (c) a fluoropolymer having at least one fluoroalcohol group having the structure:

—C($R_f$)($R_f'$)OH wherein $R_f$ and $R_f'$ are the same or different fluoroalkyl groups of from 1 to about 10 carbon atoms or taken together are $(CF_2)_n$ wherein n is 2 to about 10;
  - (d) an amorphous vinyl homopolymer of perfluoro(2,2-dimethyl-1,3-dioxole) or $CX_2=CY_2$ where X=F or $CF_3$ and Y=H or amorphous vinyl copolymers of perfluoro(2,2-dimethyl-1,3-dioxole) and $CX_2=CY_2$; and
  - (e) a nitrile/fluoroalcohol-containing polymer prepared from substituted or unsubstituted vinyl ethers; and
- (B) at least one photoactive component. Typically, the polymer in the blend have an absorption coefficient of less than 5.0 $\mu m^{-1}$ at a wavelength of 157 nm.

In a second aspect, the invention provides a process for preparing a photoresist image on a substrate comprising, in order:
- (X) imagewise exposing the photoresist layer to form imaged and non-imaged areas, wherein the photoresist layer is prepared from a photoresist composition comprising:
  - (A) at least two polymers selected from (a)–(e) above; and
  - (B) a photoactive component; and
- (Y) developing the exposed photoresist layer having imaged and non-imaged areas to form the relief image on the substrate.

DETAILED DESCRIPTION OF THE PREFERRED EMBODIMENT(S)

The photoresist element comprises a support, and at least photoresist layer; wherein the photoresist layer is prepared from a photoresist composition comprises:
- (A) at least two polymers selected from the group consisting of (a) to (e); and a photoactive component.

The polymers are useful in photoresist compositions for semiconductor lithography. In particular, since low optical absorption below 193 nm is a prime attribute of the materials of this invention, they should be of particularly utility at this wavelength. The polymers are not required to but may have an absorption coefficient of less than about 5.0 $\mu m^{-1}$ at a wavelength of about 157 nm, typically less than about 4.0 $\mu m^{-1}$ at this wavelength, and, more typically, less than about 3.5 $\mu m^{-1}$ at this wavelength.

The Polymers:

The fluorine-containing copolymer (a) comprises a repeat unit derived from at least one ethylenically unsaturated compound characterized in that the at least one ethylenically unsaturated compound is polycyclic. Copolymer (a) is selected from the group consisting of:

(a1) a fluorine-containing copolymer comprising a repeat unit derived from at least one ethylenically unsaturated compound characterized in that at least one ethylenically unsaturated compound is polycyclic and at least one other ethylenically unsaturated compound contains at least one fluorine atom covalently attached to an ethylenically unsaturated carbon atom; and (a2) a fluorine-containing copolymer comprising a repeat unit derived from at least one polycyclic ethylenically unsaturated compound containing at least one of a fluorine atom, perfluoroalkyl group, and perfluoroalkoxy group which is covalently attached to a carbon atom which is contained within a ring structure and separated from each ethylenically unsaturated carbon atom of the ethylenically unsaturated compound by at least one covalently attached carbon atom.

The at least one ethylenically unsaturated compound disclosed in (a1) may selected from the group consisting of:

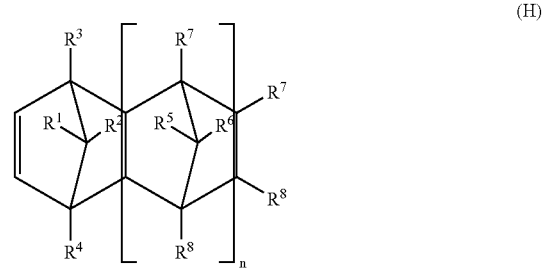

(H)

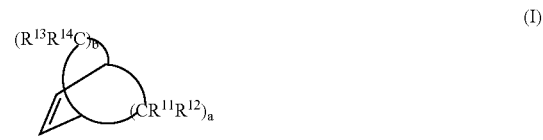

(I)

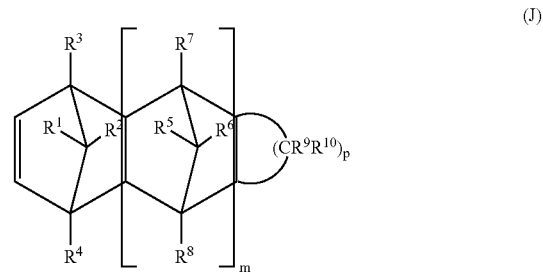

(J)

$CH_2=CHO_2CR^{15}$ (K)

$CH_2=CHOCH_2R^{15}$ (L)

$CH_2=CHOR^{15}$ and (M)

-continued

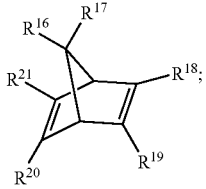
(N)

wherein:
  each of m and n is 0, 1 or 2, p is an integer of at least 3;
  a and b are independently 1 to 3 except that a is not=1 when b=2 or vice versa;
  $R^1$ to $R^{14}$ are the same or different and each represents a hydrogen atom, a halogen atom, a hydrocarbon group containing 1 to 14 carbon atoms, typically 1 to 10 carbon atoms optionally substituted with at least one O, N, S, P or halogen atom for example a carboxyl group such as a secondary or tertiary alkyl carboxylic acid group or carboxylic ester group;
  $R^{15}$ is a saturated alkyl group of about 4 to 20 carbon atoms, optionally containing one or more ether oxygens with the proviso that the ratio of carbon atoms to hydrogen atoms is greater than or equal to 0.58;
  $R^{16}$ to $R^{21}$ are each independently hydrogen atoms, $C_1$ to $C_{12}$ alkyls, $(CH_2)_qCO_2A$, $CO_2(CH_2)_qCO_2A$ or $CO_2A$ wherein q is 1 to 12 and A is hydrogen or an acid protecting group with the proviso that at least one of $R^{18}$ to $R^{21}$ is $CO_2A$.

A key characteristic of the copolymers (and photoresists comprised of the copolymers) of this invention is the cooperative combination of polycyclic repeat unit(s) with the same or different repeat units that are fluorine containing and, furthermore, with all repeat units in the copolymers not containing aromatic functionality. The presence of polycyclic repeat units in the copolymers is important in order for the copolymers to possess high resistance to plasma etching (e.g., reactive ion etching). Polycyclic repeat units also tend to provide a high glass transition temperature which is important for maintaining dimensional stability in the resist films. The presence of repeat units that are fluorine-containing is important in order for the copolymers to possess high optical transparency, i.e., to have low optical absorptions in the extreme and far UV. The absence of aromatic functionality in the repeat units of the copolymers is also required in order for the polymers to possess high optical transparency.

In certain embodiments of this invention, the fluorine-containing copolymer may be comprised of a repeat unit derived from at least one polycyclic ethylenically unsaturated compound having at least one atom or group selected from the group consisting of fluorine atom, perfluoroalkyl group, and perfluoroalkoxy group, covalently attached to a carbon atom which is contained within a ring structure. Fluorine atoms, perfluoroalkyl groups and perfluoroalkoxy groups tend to inhibit polymerization of cyclic ethylenically unsaturated compounds by metal-catalyzed addition polymerization or metathesis polymerization when such groups are attached directly to an ethylenically unsaturated carbon atom. Thus, it is important in such cases that the at least one fluorine atom, perfluoroalkyl group and perfluoroalkoxy group be separated from each ethylenically unsaturated carbon atom of the ethylenically unsaturated compound by at least one covalently attached carbon atom. Furthermore, attaching the atom and/or group directly to a ring minimizes the presence of undesirable non-fluorinated aliphatic carbon atoms.

The copolymers of this invention surprisingly have balanced properties that are important for imparting necessary properties to photoresist compositions for semiconductor applications. First, these copolymers have unexpectedly low optical absorptions in the extreme and far UV, including 193 nm and 157 nm wavelengths. Having copolymers with low optical absorptions is important for formulating high photospeed resists wherein the major amount of UV light is absorbed by the photoactive component(s) and not lost due to absorption by the copolymer (matrix of the resist). Second, resists comprising the fluorine-containing polymers of this invention desirably exhibit very low plasma etch rates. This latter property is important in affording high resolution precision resists that are required in semiconductor fabrication. Achieving simultaneously suitable values of these properties is particularly important for imaging at 157 nm. In this case, ultra thin resists are needed for high resolution, but these thin resists must nevertheless be highly etch resistant such that resist remains on imaged substrates and protects areas of underlying substrate during etching.

In the preferred embodiments of this invention, the photoresist composition comprises copolymers that comprise a repeat unit derived from at least one polycyclic comonomer (i.e., a comonomer comprising at least two rings, e.g., norbornene). This is important for three main reasons: 1) polycyclic monomers have relatively high carbon to hydrogen ratios (C:H), which results in base polymers comprised of repeat units of these polycyclic monomers generally having good plasma etch resistance; 2) polymers having repeat units derived from polyclic monomers, which preferably can be fully saturated upon polymerization, generally have good transparency characteristics; and 3) polymers prepared from polycyclic monomers usually have relatively high glass transition temperatures for improved dimensional stability during processing. The ethylenically unsaturated group may be contained within the polycyclic moiety as in norbornene or may be pendant to the polycyclic moiety as in 1-adamantane carboxylate vinyl ester. A polymer comprised of repeat units derived from polycyclic comonomers, having high C:H ratios, has a relatively low Ohnishi number (O.N.), where:

$$O. N. = N/(N_C - N_O)$$

with N being the number of atoms in the repeat unit of the polymer, $N_c$ being the number of carbon atoms in the repeat unit of the polymer, and $N_o$ being the number of oxygen atoms in the repeat unit of the polymer. There is an empirical law discovered by Ohnishi et al. (*J. Electrochem. Soc., Solid-State Sci. Technol.*, 130, 143 (1983) which states that the reactive ion etch (RIE) rate of polymers is a linear function of the. Ohnishi number (O.N.). As one example, poly(norbornene) has formula poly($C_7H_{10}$) and the O.N.=17/7=2.42. Polymers comprised predominantly of carbon and hydrogen having polycyclic moieties and relatively little functionality containing oxygen will have relatively low O.N.s and will, according to the empirical law of Ohnishi, have corresponding low (in an approximate linear manner) RIE rates.

As is well known to those skilled in the polymer art, an ethylenically unsaturated compound undergoes free radical polymerization to afford a polymer having a repeat unit that is derived from the ethylenically unsaturated compound. Specifically, an ethylenically unsaturated compound having structure:

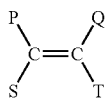

that undergoes free radical polymerization will afford a polymer having a repeat unit:

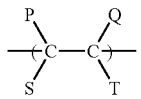

where P, Q, S, and T independently can represent, but are not limited to, H, F, Cl, Br, an alkyl group containing 1 to 14 carbon atoms, aryl, aralkyl group containing 6 to 14 carbon atoms or a cycloalkyl group containing 3 to 14 carbon atoms.

If only one ethylenically unsaturated compound undergoes polymerization, the resulting polymer is a homopolymer. If two or more distinct ethylenically unsaturated compounds undergo polymerization, the resulting polymer is a copolymer.

Some representative examples of ethylenically unsaturated compounds and their corresponding repeat units are given below:

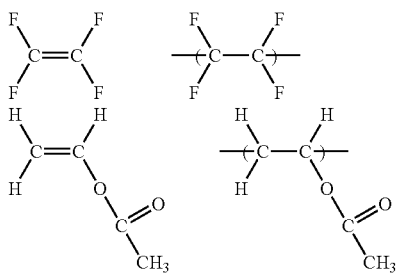

In the sections that follow, the photoresist compositions of this invention are described in terms of their component parts.

The photoresists of this invention comprise a fluorine-containing copolymer comprising a repeat unit derived from at least one ethylenically unsaturated compound characterized in that at least one ethylenically unsaturated compound is polycyclic and at least one ethylenically unsaturated compound contains at least one fluorine atom covalently attached to an ethylenically unsaturated carbon atom. Representative ethylenically unsaturated compounds that are suitable for the fluorine-containing copolymers of this invention include, but are not limited to, tetrafluoroethylene, chlorotrifluoroethylene, hexafluoropropylene, trifluoroethylene, vinylidene fluoride, vinyl fluoride, perfluoro-(2,2-dimethyl-1,3-dioxole), perfluoro-(2-methylene-4-methyl-1,3-dioxolane, $CF_2=CFO(CF_2)_tCF=CF_2$, where t is 1 or 2, and $R_fOCF=CF_2$ wherein $R_f$ is a saturated fluoroalkyl group of from 1 to about 10 carbon atoms. The fluorine-containing copolymers of this invention can be comprised of any integral number of additional fluorine-containing comonomers, which include, but are not limited to, those listed supra. Preferred comonomers are tetrafluoroethylene, chlorotrifluoroethylene, hexafluoropropylene, trifluoroethylene and $R_fOCF=CF_2$, wherein $R_f$ is a saturated fluoroalkyl group of from 1 to about 10 carbon atoms. More preferred comonomers are tetrafluoroethylene, chlorotrifluoroethylene, hexafluoropropylene, and $R_fOCF=CF_2$, wherein $R_f$ is a saturated perfluoroalkyl group of from 1 to about 10 carbon atoms. Most preferred comonomers are tetrafluoroethylene and chlorotrifluoroethylene.

Representative comonomers having structure H include, but are not limited to:

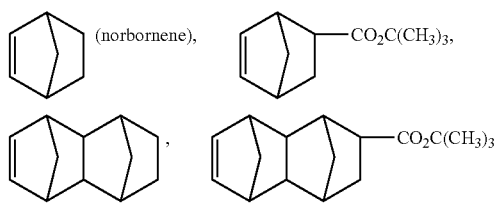

Representative comonomers having structure I include, but are not limited to:

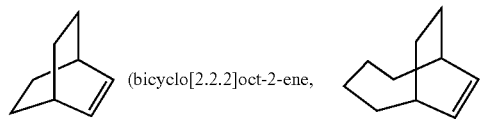

Representative comonomers having structure J include, but are not limited to:

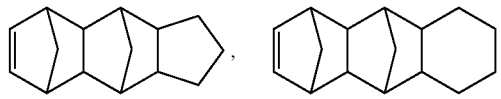

Representative comonomers having structure K include, but are not limited to:

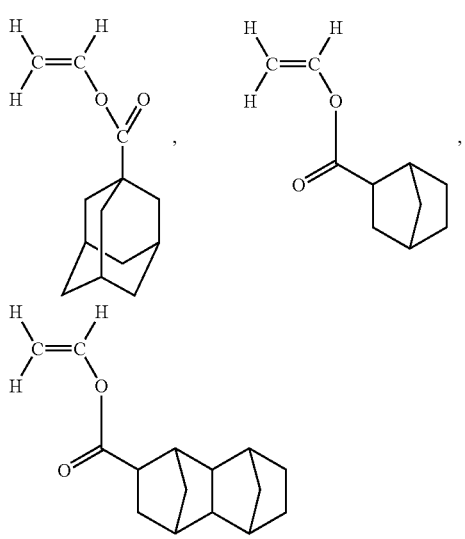

Representative comonomers having structure L include, but are not limited to:

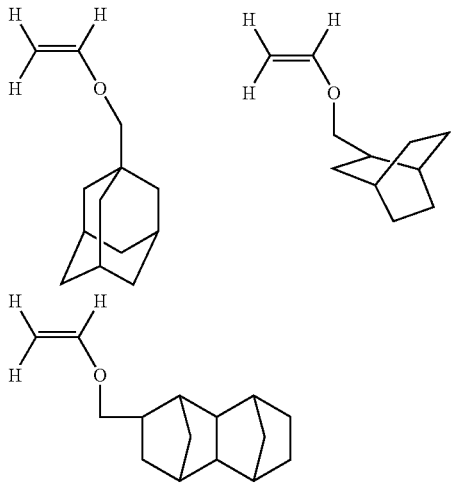

Representative comonomers having structure M include, but are not limited to:

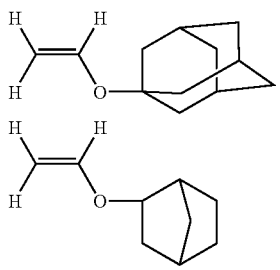

All of the inventive copolymers comprising comonomers having structures K, L and M are characterized as comprising fluorinated olefins and vinyl esters of formula $CH_2=CHO_2CR^{22}$ or vinyl ethers of formulae $CH_2=CHOCH_2R^{22}$ or $CH_2=CHOR^{22}$, wherein $R^{22}$ are hydrocarbon groups of about 4 to 20 carbon atoms with a C:H ratio that is relatively high and which is greater than 0.58 since a high C:H ratio corresponds to good plasma etch resistance. (This is in contrast to copolymers comprising fluorinated olefins and vinyl esters of formula $CH_2=CHO_2CR^{23}$ or vinyl ethers of formulae $CH_2=CHOCH_2R^{23}$ or $CH_2=CHOR^{23}$, wherein $R^{23}$ has a C:H ratio that is relatively low and which is less than 0.58. $R^{22}$ and $R^{23}$ are selected from alkyl, aryl, aralkyl, and cycloalkyl.

Representative comonomers having structure N include, but are not limited to:

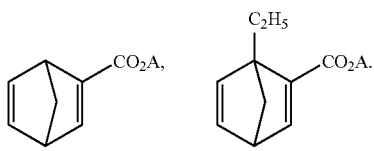

where A=H, $(CH_3)_3C$, $(CH_3)_3Si$.

In preferred embodiments described above having at least one unsaturated compound of structure H-N as the second recited comonomer, there is a limitation on the second comonomer if (and only if) the fluorine-containing copolymer is not comprised of additional comonomer(s) having functionality that is selected from a carboxylic acid and a protected acid group. In this case, the fluorine-containing copolymer has just two comonomers (the two recited comonomers and having no additional unrecited comonomers). In this case, there must be sufficient functionality that is selected from a carboxylic acid and a protected acid group present in the at least one unsaturated compound (i.e., the second recited comonomer) such that the photoresists of this invention that are comprised of the fluorine-containing polymer are developable upon imagewise exposure as explained in more detail infra. In these embodiments with the fluorine-containing copolymer having just two comonomers, the mole percentages of the two comonomers in the copolymer can range from 90%, 10% to 10%, 90% for the fluoromonomer (first recited monomer) and the second comonomer, respectively. Typically, the mole percentages of the two comonomers are in the range from 60%, 40% to 40%, 60% for the fluoromonomer (first recited monomer) and the second comonomer, respectively.

The fluorine-containing copolymers of this invention can be comprised of any integral number without limit of additional comonomers beyond the two recited comonomers (i.e., (i) at least one ethylenically unsaturated compound containing at least one fluorine atom covalently attached to an ethylenically unsaturated carbon atom; and (ii) at least one unsaturated compound selected from the group of structures H-N) for some embodiments. Representative additional comonomers can include, but are not limited to, acrylic acid, methacrylic acid, t-butyl acrylate, t-butyl methacrylate, t-amyl acrylate, t-amyl methacrylate, isobutyl acrylate, isobutyl methacrylate, ethylene, vinyl acetate, itaconic acid, and vinyl alcohol. In those embodiments where the fluorine-containing copolymer has two recited comonomers and is comprised of three or more comonomers, the mole percentage of the second recited comonomer (i.e., (ii) at least one unsaturated compound selected from the group of structures H-N) ranges from about 20 mole % to about 80 mole %, preferably ranges from about 30 mole % to about 70 mole %, more preferably ranges from about 40 mole % to about 70 mole %, and still most preferably is about 50 to about 70 mole %. Summation of the mole percentages of all other comonomers constituting the copolymer represents a balance that when added to the mole percentage of the second recited comonomer totals 100%. The sum of the mole percentages of all other comonomers present in the copolymer except for the second recited comonomer broadly is in the range from about 80 mole % to about 20 mole %. Preferably, the sum of the mole percentages of all other comonomers is in the range from about 70 mole % to about 30 mole %. More preferably, the sum of the mole percentages of all other comonomers is in the range from about 60 mole % to about 30 mole %, and, still more preferably, the sum of the mole percentages of all other comonomers is in the range from about 50 mole % to about 30 mole %. When the fluorine-containing polymer is a terpolymer, a suitable ratio of the fluoromonomer (first recited monomer) to the additional comonomer can broadly range from 5:95 to 95:5. When the fluorine-containing copolymer contains additional comonomers having functionality of acid groups or protected acid groups in sufficient amounts necessary for developability, the functionality can be present or absent in the second recited comonomer without limitation.

A given fluorine-containing copolymer, comprised of a repeat unit derived from a comonomer having at least one fluorine atom attached to an ethylenically unsaturated carbon atom, of the photoresist composition(s) of this invention can be prepared by free radical polymerization. Polymers may be prepared by bulk, solution, suspension or emulsion polymerization techniques known to those skilled in the art using free radical initiators, such as azo compounds or peroxides.

A given fluorine-containing copolymer, containing only repeat units derived from all cyclic comonomers and totally lacking a repeat unit derived from a comonomer that has one or more fluorine atom(s) attached to an ethylenically unsaturated carbon atom(s), of the photoresist composition(s) of this invention can also be prepared by free radical polymerization, but in addition can be prepared by other polymerization methods, including vinyl-addition polymerization and ring-opening methathesis polymerization (ROMP). Both of the latter polymerization methods are known to those skilled in the art. Vinyl-addition polymerization using nickel and palladium catalysts is disclosed in the following references: 1) Okoroanyanwu U.; Shimokawa, T.; Byers, J. D.; Willson, C. G. *J. Mol. Catal. A: Chemical* 1998, 133, 93; 2) PCT WO 97/33198 (Sep. 12, 1997) assigned to B. F. Goodrich; 3) Reinmuth, A.; Mathew, J. P.; Melia, J.; Risse, W. Macromol. *Rapid Commun.* 1996, 17, 173; and 4) Breunig, S.; Risse, W. *Makromol. Chem.* 1992, 193, 2915. Ring-opening metathesis polymerization is disclosed in references 1) and 2) supra using ruthenium and irridium catalysts; and also in 5) Schwab, P.; Grubbs, R. H.; Ziller, J. W. *J. Am. Chem. Soc.* 1996, 118, 100; and 6) Schwab, P.; France, M. B.; Ziller, J. W.; Grubbs, R. H. *Angew. Chem. Int. Ed. Engl.* 1995, 34, 2039.

Some of the fluorine-containing bipolymers of the resist compositions of this invention, where the bipolymer contains a fluoromonomer (e.g., TFE) and a cyclic olefin (e.g., norbornene) appear to be alternating or approximately alternating bipolymers having a structure, but not limited to, the one shown below:

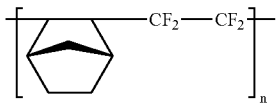

In such cases, the invention includes these alternating or approximately alternating copolymers but is not in any manner limited to just alternating copolymer structures.

These polymers are described in WO 00/17712 published on Mar. 20, 2000.

The polymer (b) is a branched polymer containing protected acid groups, said polymer comprising one or more branch segment(s) chemically linked along a linear backbone segment. The branched polymer can be formed during free radical addition polymerization of at least one ethylenically unsaturated macromer component and at least one ethylenically unsaturated comonomer. The ethylenically unsaturated macromer component has a number average molecular weight ($M_n$) between a few hundred and 40,000 and the linear backbone segment resulting from the polymerization has a number average molecular weight ($M_n$) between about 2,000 and about 500,000. The weight ratio of the linear backbone segment to the branch segment(s) is within a range of about 50/1 to about 1/10, and preferably within the range of about 80/20 to about 60/40. Typically the macromer component has a number average molecular weight ($M_n$) from 500 to about 40,000 and more typically of about 1,000 to about 15,000. Typically such an ethylenically unsaturated macromer component can have a number average molecular weight ($M_n$) equivalent to there being from about 2 to about 500 monomer units used to form the macromer component and typically between 30 and 200 monomer units.

In a typical embodiment, the branched polymer contains from 25% to 100% by weight of compatibilizing groups, i.e., functional groups present to increase compatibility with the photoacid generator, preferably from about 50% to 100% by weight, and more preferably from about 75% to 100% by weight. Suitable compatibilizing groups for ionic photoacid generators include, but are not limited to, both non-hydrophilic polar groups and hydrophilic polar groups. Suitable non-hydrophilic polar groups include, but are not limited to, cyano (—CN) and nitro (—$NO_2$). Suitable hydrophilic polar groups include, but are not limited to protic groups such as hydroxy (OH), amino ($NH_2$), ammonium, amido, imido, urethane, ureido, or mercapto; or carboxylic ($CO_2H$), sulfonic, sulfinic, phosphoric, or phosphoric acids or salts thereof. Preferably, compatibilizing groups are present in the branch segment(s).

Typically, the protected acid groups (described infra) produce carboxylic acid groups after exposure to UV or other actinic radiation and subsequent post-exposure baking (i.e., during deprotection). The branched polymer present in the photosensitive compositions of this invention, typically will contain between about 3% to about 40% by weight of monomer units containing protected acid groups, preferably between about 5% to about 50%, and more preferably between about 5% to about 20%. The branch segments of such a preferred branched polymer typically contain between 35% to 100% of the protected acid groups present. Such a branched polymer when completely unprotected (all protected acid groups converted to free acid groups) has an acid number between about 20 and about 500, preferably between about 30 and about 330, and more preferably between about 30 and about 130, and analogously the ethylenically unsaturated macromer component preferably has an acid number of about 20 and about 650, more preferably between about 90 and about 300 and the majority of the free acid groups are in the branch segments.

Each photosensitive composition of this aspect of the invention contains a branched polymer, also known as a comb polymer, which contains protected acid groups. The branched polymer has branch segments, known as polymer arms, of limited molecular weight and limited weight ratio relative to a linear backbone segment. In a preferred embodiment, a majority of the protected acid groups are present in the branch segments. The composition also contains a component, such as a photoacid generator, which renders the composition reactive to radiant energy, especially to radiant energy in the ultraviolet region of the electromagnetic spectrum and most especially in the far or extreme ultraviolet region.

In a specific embodiment, the branched polymer comprises one or more branch segments chemically linked along a linear backbone segment wherein the branched polymers have a number average molecular weight ($M_n$) of about 500 to 40,000. The branched polymer contains at least 0.5% by weight of branch segments. The branch segments, also known as polymer arms, typically are randomly distributed along the linear backbone segment. The "polymer arm" or branch segment is a polymer or oligomer of at least two repeating monomer units, which is attached to the linear backbone segment by a covalent bond. The branch segment, or polymer arm, can be incorporated into the branched polymer as a macromer component, during the addition polymerization process of a macromer and a comonomer. A "macromer" for the purpose of this invention, is a polymer, copolymer or oligomer of molecular weight ranging from several hundred to about 40,000 containing a terminal ethylenically unsaturated polymerizable group. Preferably the macromer is a linear polymer or copolymer end capped with an ethylenic group. Typically, the branched polymer is a copolymer bearing one or more polymer arms, and preferably at least two polymer arms, and is characterized in that between about 0.5 and about 80 weight %, preferably between about 5 and 50 weight % of the monomeric components used in the polymerization process is a macromer. Typically, comonomer components used along with the macromer in the polymerization process likewise contain a single ethylenic group that can copolymerize with the ethylenically unsaturated macromer.

The ethylenically unsaturated macromer and the resulting branch segment of the branched polymer, and/or the backbone of the branched polymer, can have bonded thereto one or more protected acid groups. For the purposes of this invention, a "protected acid group" means a functional group which, when deprotected, affords free acid functionality that enhances the solubility, swellability, or dispersibility in aqueous environments, of the macromer and/or the branched polymer to which it is bonded. The protected acid group may be incorporated into the ethylenically unsaturated macromer and the resulting branch segment of the branched polymer, and/or the backbone of the branched polymer, either during or after their formation. While addition polymerization using a macromer and at least one ethylenically unsaturated monomer is preferred for forming the branched polymer, all known methods of preparing branched polymers using either addition or condensation reactions can be utilized in this invention. Furthermore, use of either preformed backbones and branch segments or in situ polymerized segments are also applicable to this invention.

The branch segments attached to the linear backbone segment can be derived from ethylenically unsaturated macromers prepared according to the general descriptions in U.S. Pat. No. 4,680,352 and U.S. Pat. No. 4,694,054. Macromers are prepared by free radical polymerization processes employing a cobalt compound as a catalytic chain transfer agent and particularly a cobalt(II) compound. The cobalt(II) compound may be a pentacyanocobalt(II) compound or a cobalt(II) chelate of a vicinal iminobydroxyimino compound, a dihydroxyimino compound, a diazadihydroxy-iminodialkyldecadiene, a diazadihydroxyimino-dialkylundecadiene, a tetraazatetraalkylcyclotetradecatetraene, a tetraazatetraalkylcyclotedodecatetraene, a bis(difluoroboryl) diphenyl glyoximato, a bis(difluoroboryl) dimethyl glyoximato, a N,N'-bis(salicylidene)ethylenediamine, a dialkyl-diaza-dioxodialkyldodecadiene, or a dialkyldiazadioxodi-alkyl-tridecadiene. Low molecular weight methacrylate macromers may also be prepared with a pentacyanocobalt (II) catalytic chain transfer agent as disclosed in U.S. Pat. No. 4,722,984.

Illustrative macromers using this approach are methacrylate polymers with acrylates or other vinyl monomers wherein the polymers or copolymers have a terminal ethylenic group and a hydrophilic functional group. Preferred monomer components for use in preparing macromers include: tertiary-butyl methacrylate (tBMA), tertiary-butyl acrylate (tBA), methyl methacrylate (MMA); ethyl methacrylate (EMA); butyl methacrylate (BMA); 2-ethylhexyl methacrylate; methyl acrylate (MA); ethyl acrylate (EA); butyl acrylate (BA); 2-ethylhexyl acrylate; 2-hydroxyethyl methacrylate (HEMA); 2-hydroxyethyl acrylate (HEA); methacrylic acid (MA); acrylic acid (AA); esters of acrylic and methacrylic acid wherein the ester group contains from 1 to 18 carbon atoms; nitriles and amides of acrylic and methacrylic acid (e.g., acrylonitrile); glycidyl methacrylate and acrylate; itaconic acid (IA) and itaconic acid anhydride (ITA), half ester and imide; maleic acid and maleic acid anhydride, half ester and imide; aminoethyl methacrylate; t-butyl aminoethyl methacrylate; dimethyl aminoethyl methacrylate; diethyl aminoethyl methacrylate; aminoethyl acrylate; dimethyl aminoethyl acrylate; diethyl aminoethyl acrylate; acrylamide; N-t-octyl acrylamide; vinyl methyl ether; styrene (STY); alpha-methyl styrene (AMS); vinyl acetate; vinyl chloride; and the like.

Itaconic acid anhydride (ITA, 2-methylenesuccinic anhydride, CAS No.=2170-03-8) is a particularly advantageous comonomer for use in the branched polymer since it has two active functional groups in the anhydride form, which become three upon ring opening to afford diacid. The ethylenically unsaturated moiety is a first functional group, which provides capability for this comonomer to be incorporated into a copolymer by, for example, free radical polymerization. The anhydride moiety is a second functional group that is capable of reacting with a variety of other functional groups to afford covalently bonded products. An example of a functional group that an anhydride moiety can react with is a hydroxy group in an alcohol to form an ester linkage. Upon reaction of the anhydride moiety of ITA with a hydroxy group, there is formed an ester linkage and a free carboxyic acid moiety, which is a third functional group. The carboxylic acid functional group is useful in imparting aqueous processability to the resists of this invention. If a PAG is utilized having a hydroxy group, it is possible, as illustrated in some of the examples, to covalently link (tether) a PAG (or other photoactive components) to a branched polymer comprised of ITA comonomer or the like via this type of ester linkage (or other covalent linkages, such as amide, etc.).

The branched polymer may be prepared by any conventional addition polymerization process. The branched polymer, or comb polymer, may be prepared from one or more compatible ethylenically unsaturated macromer components and one or more compatible, conventional ethylenically unsaturated comonomer component(s). Preferred addition polymerizable, ethylenically unsaturated comonomer components are acrylates, methacrylates, and styrenics as well as mixtures thereof. Suitable addition polymerizable, ethylenically unsaturated comonomer components include: tertiary-butyl methacrylate (tBMA), tertiary-butyl acrylate (tBA), methyl methacrylate (MMA); ethyl methacrylate (EMA); butyl methacrylate (BMA); 2-ethylhexyl methacrylate; methyl acrylate (MA); ethyl acrylate (EA); butyl acrylate (BA); 2-ethylhexyl acrylate; 2-hydroxyethyl methacrylate (HEMA); 2-hydroxyethyl acrylate (HEA); methacrylic acid (MAA); acrylic acid (AA); acrylonitrile (AN); methacrylonitrile (MAN); itaconic acid {IA) and itaconic acid anhydride (ITA), half ester and imide; maleic acid and maleic acid anhydride, half ester and imide; aminoethyl methacrylate; t-butyl aminoethyl methacrylate; dimethyl aminoethyl methacrylate; diethyl aminoethyl methacrylate; aminoethyl acrylate; dimethyl aminoethyl acrylate; diethyl aminoethyl acrylate; acrylamide; N-t-octyl acrylamide; vinylmethyl ethers; styrene (S); alpha-methyl styrene; vinyl acetate; vinyl chloride; and the like. The majority of the copolymerizable monomer must be acrylate or styrenic or copolymers of these monomers with acrylates and other vinyl monomers.

Each constituent linear backbone segment and/or branch segment of the branched polymer of this invention may contain a variety of functional groups. A "functional group" is considered to be any moiety capable of being attached to a backbone segment or a branch segment by a direct valence bond or by a linking group. Illustrative of functional groups which can be borne by the backbone segment or the branch segments are —COOR$^{24}$; —OR$^{24}$; —SR$^{24}$ wherein R$^{24}$ can be hydrogen, alkyl group having 1 to 12 carbon atoms; cycloalkyl group of 3–12 carbon atoms; aryl, alkaryl or aralkyl group having 6 to 14 carbon atoms; a heterocyclic group containing 3 to 12 carbon atoms and additionally containing an S, O, N or P atom; or —OR$^{27}$ where R$^{27}$ can be alkyl of 1–12 carbon atoms, aryl, alkaryl or aralkyl group having 6 to 14 carbon atoms; —CN; —N R$^{25}$ R$^{26}$ or

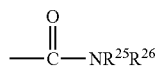

wherein R$^{25}$ and R$^{26}$ can be hydrogen, alkyl group having 1 to 12 carbon atoms; cycloalkyl group having of 3–12 carbon atoms; aryl, alkaryl, aralkyl of 6 to 14 carbon atoms; —CH$_2$OR$^{28}$ wherein R$^{28}$ is hydrogen, alkyl of 1 to 12 carbon atoms; or cycloalkyl of 3–12 carbon atoms, aryl, alkaryl, aralkyl having 6 to 14 carbon atoms, or together R$^{25}$ and R$^{26}$ can form a heterocyclic ring having 3 to 12 carbon atoms and containing at least one S, N, O or P;

wherein R$^{29}$, R$^{30}$ and R$^{31}$ can be hydrogen, alkyl of 1 to 12 carbon atoms or cycloalkyl of 3–12 carbon atoms; aryl, alkaryl, aralkyl of 6 to 14 carbon atoms, or —COOR$^{24}$ or when taken together R$^{29}$, R$^{30}$ and/or R$^{31}$ can form a cyclic group; —SO$_3$H; a urethane group; an isocyanate or blocked isocyanate group; a urea group; an oxirane group; an aziridine group; a quinone diazide group; an azo group; an azide group; a diazonium group; an acetylacetoxy group; —Si R$^{32}$R$^{33}$R$^{34}$ wherein R$^{32}$, R$^{33}$ and R$^{34}$ can be alkyl having 1–12 carbon atoms or cycloalkyl of 3–12 carbon atoms or —OR$^{35}$ where R$^{35}$ is alkyl of 1–12 carbon atoms or cycloalkyl of 3–12 carbon atoms; aryl, alkaryl or aralkyl of 6 to 14 carbon atoms; or an —OSO$_2$R$^{36}$, —OPO$_2$R$^{36}$, —PO$_2$R$^{36}$, —P R$^{36}$R$^{37}$R$^{38}$, —OPOR$^{36}$, —S R$^{36}$R$^{37}$, or —N+R$^{36}$R$^{37}$R$^{38}$ group (where R$^{36}$, R$^{37}$, and R$^{38}$ can be hydrogen, alkyl of 1 to 12 carbon atoms or cycloalkyl of 3–12 carbon atoms; aryl, alkaryl or aralkyl of 6 to 14 carbon atoms; or a salt or onium salt of any of the foregoing. Preferred functional groups are —COON, —OH, —NH$_2$, an amide group, a vinyl group, a urethane group, an isocyanate group, a blocked isocyanate group or combinations thereof. Functional groups may be located anywhere on the branched polymer. However, it is sometimes desirable to choose comonomers which impart bulk polymer characteristics to the linear backbone segment of the branched polymer and macromers which impart physical and chemical functionality to the branch segments in addition to hydrophilicity, such as solubility, reactivity, and the like.

In certain preferred embodiments of this invention, the branched polymer contains functional groups that are compatible with the photoacid generator, said functional groups being distributed in the branched polymer such that 25 to 100% of the functional groups are present in the segment of the branched polymer containing a majority of the protected acid groups. These functional groups are desirable since having enhanced compatibility of the photoacid generator with the branched polymer segmented having the majority of protected acid groups results in higher photospeed and perhaps higher resolution and/or other desirable properties of resists comprised of these branched polymer(s) having these functional groups to promote compatibility. For an ionic PAG, such as a triarylsulfonium salt, functional groups that promote compatibility include, but are not limited to, polar non-hydrophilic groups (e.g., nitro or cyano) and polar hydrophilic groups (e.g., hydroxy, carboxyl). For a nonionic PAG, such as structure III infra, preferred functional groups for imparting compatibility are less polar than the polar groups listed above. For the latter case, suitable functional groups include, but are not limited to, groups which impart rather similar chemical and physical properties to those of the non-ionic PAG. As two specific examples, aromatic and perfluoroalkyl functional groups are effective in promoting compatibility of the branched polymer with a nonionic PAG, such as structure III given infra.

In some preferred embodiments, the branched polymer is an acrylic/methacrylic/styrenic copolymer being at least 60% by weight acrylate and having at least 60% of methacrylate repeat units present either in a first location or a second location, the first location being one of the segments (i.e., branch segment(s) or linear backbone segment), the second location being a segment different from the first location, wherein at least 60% of the acrylate repeat units are present in the second location.

In some embodiments, the branched polymer is a fluorine-containing graft copolymer comprising a repeat unit derived from at least one ethylenically unsaturated compound containing at least one fluorine atom covalently attached to an ethylenically unsaturated carbon atom. The repeat unit bearing at least one fluorine atom can be either in the linear polymer backbone segment or in the branch polymer segment(s); preferably, it is in the linear polymer backbone segment. Representative ethylenically unsaturated compounds that are suitable for the fluorine-containing graft copolymers of this invention include, but are not limited to, tetrafluoroethylene, chlorotrifluoroethylene, hexafluoropropylene, trifluoroethylene, vinylidene fluoride, vinyl fluoride, and R$_f$OCF═CF$_2$ wherein R$_f$ is a saturated perfluoroalkyl group of from 1 to about 10 carbon atoms. The fluorine-containing copolymers of this invention can be comprised of any integral number of additional fluorine-containing comonomers, which include, but are not limited to, those listed supra. Preferred comonomers are tetrafluoroethylene, chlorotrifluoroethylene, hexafluoropropylene, trifluoroethylene and R$_f$OCF═CF$_2$, wherein R$_f$ is a saturated perfluoroalkyl group of from 1 to about 10 carbon atoms. More preferred comonomers are tetrafluoroethylene, chlorotrifluoroethylene, hexafluoropropylene, and R$_f$OCF═CF$_2$, wherein R$_f$ is a saturated perfluoroalkyl group of from 1 to about 10 carbon atoms. Most preferred comonomers are tetrafluoroethylene and chlorotrifluoroethylene.

In some preferred embodiments, the fluorine-containing graft copolymer is further comprised of a repeat unit derived from at least one unsaturated compound selected from the group consisting of structures shown for polymer (a) above.

In one embodiment of this invention, a PAG is covalently linked (i.e., tethered) to the fluorine-containing graft copolymer to afford a photoresist.

In some preferred embodiments, the branched polymer is a fluorine-containing copolymer comprising a repeat unit derived from at least one ethylenically unsaturated compound containing a fluoroalcohol functional group having the structure:

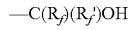
—C(R$_f$)(R$_f'$)OH wherein R$_f$ and R$_f'$ are the same or different fluoroalkyl groups of from 1 to about 10 carbon atoms or taken together are (CF$_2$)$_n$ wherein n is 2 to 10.

A given fluorine-containing branched copolymer comprising a repeat unit derived from at least one ethylenically unsaturated compound containing a fluoroalcohol functional group according to this invention can have fluoroalkyl groups present as part of the fluoroalcohol functional group. These fluoroalkyl groups are designated as R$_f$ and R$_f'$, which can be partially fluorinated alkyl groups or fully fluorinated alkyl groups (i.e., perfluoroalkyl groups). Broadly, R$_f$ and R$_f'$ are the same or different fluoroalkyl groups of from 1 to about 10 carbon atoms or taken together are (CF$_2$)$_n$ wherein n is 2 to 10. (In the last sentence, the terms "taken together" indicate that R$_f$ and R$_f'$ are not separate, discrete fluorinated alkyl groups, but that together they form a ring structure such as is illustrated below in case of a 5-membered ring:

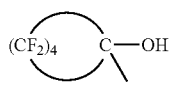

R$_f$ and R$_f'$ can be partially fluorinated alkyl groups without limit according to the invention except that there must be a sufficient degree of fluorination present to impart acidity to the hydroxyl (—OH) of the fluoroalcohol functional group, such that the hydroxylproton is substantially removed in basic media, such as in aqueous sodium hydroxide solution or tetraalkylammonium hydroxide solution. In preferred cases according to the invention, there will be sufficient fluorine substitution present in the fluorinated alkyl groups of the fluoroalcohol functional group such that the hydroxyl group will have a pKa value as follows: 5<pKa<11. Preferably, R$_f$ and R$_f'$ are independently perfluoroalkyl group of 1 to 5 carbon atoms, and, most perferably, R$_f$ and R$_f'$ are both trifluoromethyl (CF$_3$). Preferably, each fluorine-containing copolymer according to this invention has an absorption coefficient of less than 4.0 μm$^{-1}$ at a wavelength of 157 nm, preferably of less than 3.5 μm$^{-1}$ at this wavelength, and, more preferably, of less than 3.0 μm$^{-1}$ at this wavelength.

The fluorinated polymers, photoresists, and processes of this invention that include a fluoroalcohol functional group may have the structure:

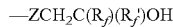
—ZCH$_2$C(R$_f$)(R$_f'$)OH wherein R$_f$ and R$_f'$ are the same or different fluoroalkyl groups of from 1 to about 10 carbon atoms or taken together are (CF$_2$)$_n$ wherein n is 2 to 10; Z is selected from the group consisting of oxygen, sulfur, nitrogen, phosphorous, other Group VA element, and other Group VIA element. By the terms "other Group VA element" and "other Group VIA element", these terms are understood to mean herein any other element in one of these groups of the periodic table that is other than the recited elements (i.e., oxygen, sulfur, nitrogen, phosphorous) in these groups. Oxygen is the preferred Z group.

Some illustrative, but nonlimiting, examples of representative comonomers containing a fluoroalcohol functional group and within the scope of the invention are presented below:

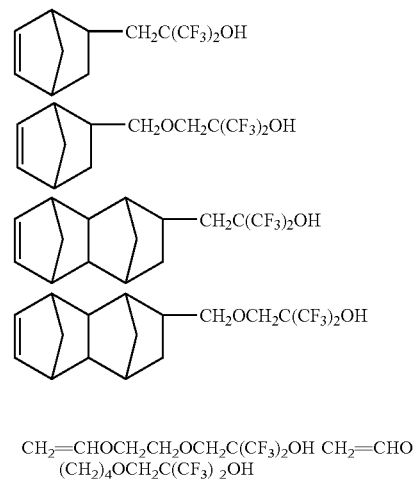

CH$_2$=CHOCH$_2$CH$_2$OCH$_2$C(CF$_3$)$_2$OH  CH$_2$=CHO(CH$_2$)$_4$OCH$_2$C(CF$_3$)$_2$OH

As is well known to those skilled in the polymer art, an ethylenically unsaturated compound undergoes free radical polymerization to afford a polymer having a repeat unit that is derived from the ethylenically unsaturated compound. Specifically, ethylenically unsaturated compound having structure:

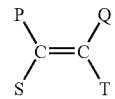

are described above with regard to copolymer (a1).

The fluoropolymer having at least one fluoroalcohol group (c) is selected from the group consisting of:

(c1) a fluorine-containing polymer comprising a repeat unit derived from at least one ethylenically unsaturated compound containing a fluoroalcohol functional group having the structure:

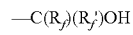
—C(R$_f$)(R$_f'$)OH wherein R$_f$ and R$_f'$ are as described above;

(c2) a fluorine-containing copolymer comprising a repeat unit derived from at least one ethylenically unsaturated compound characterized in that at least one ethylenically unsaturated compound is cyclic or polycyclic, at least one ethylenically unsaturated compound contains at least one fluorine atom covalently attached to an ethylenically unsaturated carbon atom, and at least one ethylenically unsaturated compound is comprised of a fluoroalcohol functional group having the structure:

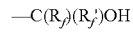
—C(R$_f$)(R$_f'$)OH wherein R$_f$ and R$_f'$ are as described above;

(c3) a fluorine-containing copolymer comprising:
  (i) a repeat unit derived from at least one ethylenically unsaturated compound containing at least three fluorine atoms covalently attached to two ethylenically unsaturated carbon atoms; and (ii) a repeat unit derived from an ethylenically unsaturated compound comprised of a fluoroalcohol functional group having the structure:

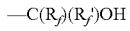
—C(R_f)(R_f')OH wherein $R_f$ and $R_f'$ are as described above.

(c4) a fluorine-containing copolymer comprising a repeat unit derived from at least one ethylenically unsaturated compound containing a fluoroalcohol functional group having the structure:

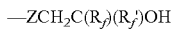
—ZCH_2C(R_f)(R_f')OH wherein $R_f$ and $R_f'$ are as described above; and Z is an element selected from Group VA, and other Group VIA of the Periodic Table of the Elements (CAS Version). Typically X is a sulfur, oxygen, nitrogen or phosphorus atom;

(c5) a fluorine-containing polymer comprising the structure:

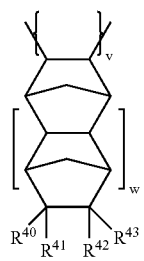

wherein each of $R^{40}$, $R^{41}$, $R^{42}$, and $R^{43}$ independently is hydrogen atom, a halogen atom, a hydrocarbon group containing from 1 to 10 carbon atoms, a hydrocarbon group substituted with O, S, N, P or halogen and having 1 to 12 carbons atoms, for example, an alkoxy group, a carboxylic acid group, a carboxylic ester group or a functional group containing the structure:

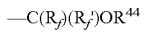
—C(R_f')(R_f)OR^{44} wherein $R_f$ and $R_f'$ are as describe above; $R^{44}$ is a hydrogen atom or an acid- or base-labile protecting group; v is the number of repeat units in the polymer; w is 0–4; at least one of the repeat units has a structure whereby at least one of $R^{40}$, $R^{41}$, $R^{42}$, and $R^{43}$ contains the structure $C(R_f')(R_f)OR^{44}$, for example, $R^{40}$, $R^{41}$, and $R^{42}$ are a hydrogen atom and $R^{43}$ is $CH_2OCH_2C(CF_3)_2OCH_2CO_2C(CH_3)_3$ wherein $CH_2CO_2C(CH_3)_3$ is an acid or base labile protecting group or $R^{43}$ is $OCH_2C(CF_3)_2OCH_2CO_2C(CH_3)_3$ wherein $OCH_2CO_2C(CH_3)_3$ is an acid or base labile protecting group; and (c6) a polymer comprising:
(i) a repeat unit derived from at least one ethylenically unsaturated compound containing a fluoroalcohol functional group having the structure:

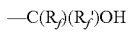
—C(R_f)(R_f')OH wherein $R_f$ and $R_f'$ areas described above; and
(ii) a repeat unit derived from at least one ethylenically unsaturated compound having the structure:

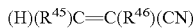
(H)(R^{45})C=C(R^{46})(CN)

wherein $R^{45}$ is a hydrogen atom or CN group; $R^{46}$ is $C_1$–$C_8$ alkyl group, hydrogen atom, or $CO_2R^{47}$ group, where $R^{47}$ is $C_1$–$C_8$ alkyl group or hydrogen atom.

The fluoropolymer or copolymer comprises a repeat unit (discussed infra) derived from at least one ethylenically unsaturated compound containing a fluoroalcohol functional group that can have fluoroalkyl groups present as part of the fluoroalcohol group and are described earlier with regard to copolymer (b). These fluoroalkyl groups are designated $R_f$ and $R_f'$ as described above.

As is well known to those skilled in the polymer art, an ethylenically unsaturated compound undergoes free radical polymerization to afford a polymer having a repeat unit that is derived from the ethylenically unsaturated compound. Specifically, an ethylenically unsaturated compound having structure:

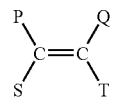

is described above with regard to copolymer (a1).

Each fluorine-containing copolymer according to this invention has an absorption coefficient of less than 4.0 $\mu m^{-1}$ at a wavelength of 157 nm, preferably of less than 3.5 $\mu m^{-1}$ at this wavelength, more preferably, of less than 3.0 $\mu m^{-1}$ at this wavelength, and, still more preferably, of less than 2.5 $\mu m^{-1}$ at this wavelength.

The fluorinated polymers, photoresists, and processes of this invention that include a fluoroalcohol functional group may have the structure:

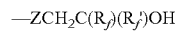
—ZCH_2C(R_f)(R_f')OH wherein $R_f$ and $R_f'$ are as described above; Z is as described above Some illustrative, but nonlimiting, examples of representative comonomers containing a fluoroalcohol functional group and within the scope of the invention are presented below:

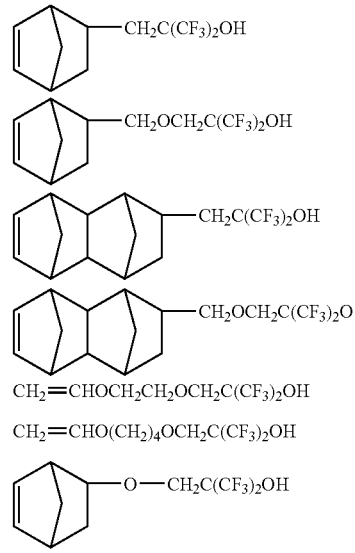

-continued

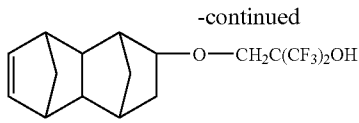

Various bifunctional compounds which can initially afford crosslinking and subsequently be cleaved (e.g., upon exposure to strong acid) are also useful as comonomers in the copolymers of this invention. As an illustrative, but non-limiting example, the bifunctional comonomer NB—F—OMOMO—F—NB is desirable as a comonomer in the copolymers of this invention. This and similar bifunctional comonomers, when present in the copolymer component(s) of photoresist compositions of this invention, can afford copolymers that are of higher molecular weight and are lightly crosslinked materials. Photoresist compositions, incorporating these copolymers comprised of bifunctional monomers, can have improved development and imaging characteristics, since, upon exposure (which photochemically generates strong acid as explained infra), there results cleavage of the bifunctional group and consequently a very significant drop in molecular weight, which factors can afford greatly improved development and imaging characteristics (e.g., improved contrast). These fluoroalcohol groups and their embodiments are described in more detail as above and in PCT/US00/11539 filed Apr. 28, 2000.

At least a portion of the nitrile functionality that is present in the nitrile/fluoroalcohol polymers results from incorporation of repeat unit(s) derived from at least one ethylenically unsaturated compound having at least one nitrile group and having the structure:

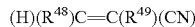

wherein $R^{48}$ is a hydrogen atom or cyano group (CN); $R^{49}$ is an alkyl group ranging from 1 to about 8 carbon atoms, $CO_2R^{50}$ group wherein $R^{50}$ is an alkyl group ranging from 1 to about 8 carbon atoms, or hydrogen atom. Acrylonitrile, methacrylonitrile, fumaronitrile (trans-1,2-dicyanoethylene), and maleonitrile (cis-1,2-dicyanoethylene) are preferred. Acrylonitrile is most preferred.

The nitrile/fluoroalcohol polymers typically are characterized in having a repeat unit derived from at least one ethylenically unsaturated compound containing the fluoroalcohol functional group that is present in the nitrile/fluoroalcohol polymers from about 10 to about 60 mole percent and a repeat unit derived from the at least one ethylenically unsaturated compound containing at least one nitrile group present in the polymer from about 20 to about 80 mole percent. The nitrile/fluoroalcohol polymers more typically with respect to achieving low absorption coefficient values are characterized in having a repeat unit derived from at least one ethylenically unsaturated compound containing the fluoroalcohol functional group that is present in the polymers at less than or equal to 45 mole percent, and, still more typically, at less than or equal to 30 mole percent with relatively small amounts of a repeat unit containing the nitrile group making at least a portion of the balance of the polymer.

In one embodiment, the polymer includes at least one protected functional group. The functional group of the at least one protected functional group is, typically, selected from the group consisting of acidic functional groups and basic functional groups. Nonlimiting examples of functional groups of the protected functional group are carboxylic acids and fluoroalcohols.

In another embodiment, a nitrile/fluoroalcohol polymer can include aliphatic polycyclic functionality. In this embodiment, the percentage of repeat units of the nitrile/fluoroalcohol polymer containing aliphatic polycyclic functionality ranges from about 1 to about 70 mole percent; preferably from about 10 to about 55 mole percent; and more typically ranges from about 20 to about 45 mole percent.

The nitrile/fluoroalcohol polymers can contain additional functional groups beyond those specifically mentioned and referenced herein with the proviso that, preferably, aromatic functionality is absent in the nitrile/fluoroalcohol polymers. The presence of aromatic functionality in these polymers has been found to detract from their transparency and result in their being too strongly absorbing in the deep and extreme UV regions to be suitable for use in layers that are imaged at these wavelengths.

In some embodiments, the polymer is a branched polymer comprising one or more branch segment(s) chemically linked along a linear backbone segment. The branched polymer can be formed during free radical addition polymerization of at least one ethylenically unsaturated macromer component and at least one ethylenically unsaturated comonomer. The branched polymer may be prepared by any conventional addition polymerization process. The branched polymer, or comb polymer, may be prepared from one or more compatible ethylenically unsaturated macromer components and one or more compatible, conventional ethylenically unsaturated macromer components and one or more compatible, conventional ethylenically unsaturated monomer component(s). Typically addition polymerizable, ethylenically unsaturated monomer components are acrylonitrile, methacrylonitrile, fumaronitrile, maleonitrile, protected and/or unprotected unsaturated fluoroalcohols, and protected and/or unprotected unsaturated carboxylic acids. The structure and process of making this type of branched polymers is discussed for polymer type (b) above, and as described in WO 00/25178.

The fluoropolymers with at least one fluoroalcohol may further comprise a spacer group selected from the group consisting of ethylene, alpha-olefins, 1,1'-disubstituted olefins, vinyl alcohols, vinyl ethers, and 1,3-dienes.

Polymer (d) comprises an amorphous vinyl homopolymer of perfluoro(2,2-dimethyl-1,3-dioxole) or $CX_2=CY_2$ where X=F or $CF_3$ and Y=–H or amorphous vinyl copolymer of perfluoro(2,2-dimethyl-1,3-dioxole) and $CX_2=CY_2$, said homopolymer or copolymer optionally containing one or more comonomer $CR^{51}R^{52}=CR^{53}R^{54}$ where each of the $R^{51}$, $R^{52}$, $R^{53}$ is selected independently from H or F and where $R^{54}$ is selected from the group consisting of —F, —$CF_3$, —$OR^{55}$ where $R^{55}$ is CnF2n+1 with n=1 to 3, —OH (when $R^{53}$=H), and Cl (when $R^{51}$, $R^{52}$, and $R^{53}$=F). Polymer (d) may additionally comprise amorphous vinyl copolymers of $CH_2=CHCF_3$ and $CF_2=CF_2$ in 1:2 to 2:1 ratio, $CH_2=CHF$ and $CF_2=CFCl$ in 1:2 to 2:1 ratio, $CH_2=CHF$ and $CClH=CF_2$ in 1:2 to 2:1 ratio, perfluoro(2-methylene-4-methyl-1,3-dioxolane) in any ratio with perfluoro(2,2-dimethyl-1,3-dioxole), perfluoro(2-methylene-4-methyl-1,3-dioxolane) in any ratio with vinylidene fluoride that is amorphous, and the homopolymer of perfluoro(2-methylene-4-methyl-1,3-dioxolane).

These polymers were made by polymerization methods known in the art for fluoropolymers. All of the polymers can be made by sealing the monomers, an inert fluid (such as $CF_2ClCCl_2F$, $CF_3CFHCFHCF_2CF_3$, or carbon dioxide), and a soluble free radical initiator such as HFPO dimer peroxide 1 or Perkadox® 16N in a chilled autoclave and then heating

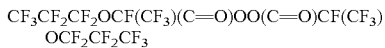

1 as appropriate to initiate polymerization. For HFPO dimer peroxide 1 room temperature (~25° C.) is a convenient polymerization temperature whereas for Perkadox® temperatures from 60 to 90° C. can be used. Depending upon the monomers and the polymerization temperature, pressures can vary from atmospheric pressure to 500 psi or higher. The polymer can then be isolated by filtration when formed as an insoluble precipitate or by evaporation or precipitation when soluble in the reaction mixture. In many instances the apparently dry polymer still retains considerable solvent and/or unreacted monomer and must be dried further in a vacuum oven preferably under nitrogen bleed. Many of the polymers can also be made by aqueous emulsion polymerization effected by sealing deionized water, an initiator such as ammonium persulfate or Vazo® 56 WSP, monomers, a surfactant such as ammonium perfluorooctanoate or a dispersant such as methyl cellulose in a chilled autoclave and heating to initiate polymerization. The polymer can be isolated by breaking any emulsion formed, filtering, and drying. In all instances oxygen should be excluded from the reaction mixture. Chain transfer agents such as chloroform may be added to lower molecular weight.

A nitrile/fluoroalcohol-containing polymer prepared from the substituted or unsubstituted vinyl ethers (e) comprise:

(e1) a polymer comprising:
(i) a repeat unit derived from at least one ethylenically unsaturated compound comprising a vinyl ether functional group and having the structure:

$CH_2=CHO-R^{56}$ where $R^{56}$ is an alkyl group having 1 to 12 carbon atoms, aryl, aralkyl, or alkaryl group having from 6 to about 20 carbon atoms, or said groups substituted with a S, O, N or P atom; and (ii) a repeat unit derived from at least one ethylenically unsaturated compound having the structure:

$(H)(R^{57})C=C(R^{58})(CN)$ wherein $R^{57}$ is a hydrogen atom or cyano group; $R^{58}$ is an alkyl group ranging from 1 to about 8 carbon atoms, $CO_2 R^{59}$ group wherein $R^{59}$ is an alkyl group ranging from 1 to about 8 carbon atoms, or hydrogen atom; and (iii) a repeat unit derived from at least one ethylenically unsaturated compound comprising an acidic group; and (e2) a polymer comprising:
(i) a repeat unit derived from at least one ethylenically unsaturated compound comprising a vinyl ether functional group and a fluoroalcohol functional group and having the structure:

$C(R^{60})(R^{61})=C(R^{62})-O-D-C(R_f)(R_f')OH$ wherein $R^{60}$, $R^{61}$, and $R^{62}$ independently are hydrogen atom, alkyl group ranging from 1 to about 3 carbon atoms,; D is at least one atom that links the vinyl ether functional group through an oxygen atom to a carbon atom of the fluoroalcohol functional group; $R_f$ and $R_f'$ are as described above; and (ii) a repeat unit derived from at least one ethylenically unsaturated compound having the structure:

$(H)(R^{57})C=C(R^{58})(CN)$ wherein $R^{57}$ is a hydrogen atom or cyano group; $R^{58}$ is an alkyl group ranging from 1 to about 8 carbon atoms, $CO_2R^{59}$ group wherein $R^{59}$ is an alkyl group ranging from 1 to about 8 carbon atoms, or hydrogen atom; and (iii) a repeat unit derived from at least one ethylenically unsaturated compound comprising an acidic group.

The fluoroalcohol groups and embodiments are described in more detail for polymers (c6) above. Some illustrative, but nonlimiting, examples of vinyl ether monomers falling within the generalized structural formula (given supra) containing a fluoroalcohol functional group and within the scope of the invention are presented below:

$CH_2=CHOCH_2CH_2OCH_2C(CF_3)_2OH$  $CH_2=CHO(CH_2)_4OCH_2C(CF_3)_2OH$

The nitrile groups and their embodiments, and linear and branched polymers made with nitrile and fluoroalcohol groups and their embodiments, are also described and referenced in more detail for polymers (c6) above.

These polymers may be present in the amount of about 10 to about 99.5% by weight, based on the weight of the total composition (solids).

Photoactive Component (PAC)

If the polymers in the polymer blend are not photoactive, the compositions of this invention may contain a photoactive component (PAC) that is not chemically bonded to the fluorine-containing polymer, i.e. the photoactive component is a separate component in the composition. The photoactive component usually is a compound that produces either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG).

Suitable photoacid generators for this invention include, but are not limited to, 1) sulfonium salts (structure I), 2) iodonium salts (structure II), and 3) hydroxamic acid esters, such as structure III.

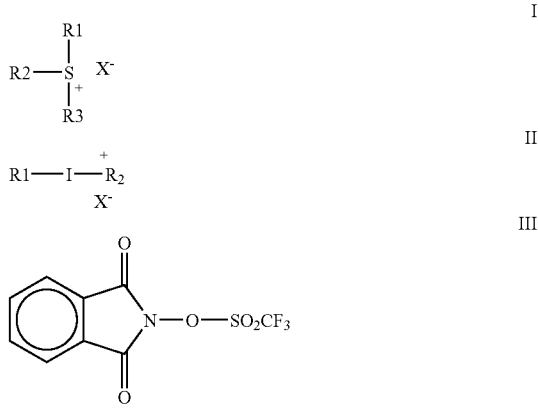

In structures I–II, $R_1$–$R_3$ are independently substituted or unsubstituted aryl or substituted or unsubstituted $C_1$–$C_{20}$ alkylaryl (aralkyl). Representative aryl groups include, but are not limited to, phenyl and naphthyl. Suitable substituents include, but are not limited to, hydroxyl (—OH) and $C_1$–$C_{20}$ alkyloxy (e.g., $C_{10}H_{21}O$). The anion X— in structures I–II can be, but is not limited to, $SbF_6$— (hexafluoroantimonate), $CF_3SO_3$— (trifluoromethylsulfonate=triflate), and $C_4F_9SO_3$— (perfluorobutylsulfonate).

Dissolution Inhibitor

Various dissolution inhibitors can be utilized in this invention. Ideally, dissolution inhibitors (Dis) for the far and extreme UV resists (e.g., 193 nm resists) are designed/chosen to satisfy multiple materials needs including dissolution inhibition, plasma etch resistance, and adhesion behavior of resist compositions comprising a given DI additive. Some dissolution inhibiting compounds also serve as plasticizers in resist compositions.

Other Components

The compositions of this invention can contain optional additional components. Examples of additional components which can be added include, but are not limited to, resolution enhancers, adhesion promoters, residue reducers, coating aids, plasticizers, and $T_g$ (glass transition temperature) modifiers. Crosslinking agents may also be present in negative-working resist compositions. Some typical crosslinking agents include bis-azides, such as,4,4'-diazidodiphenyl sulfide and 3,3'-diazidodiphenyl sulfone. Typically, a negative working composition containing at least one crosslinking agent also contains suitable functionality (e.g., unsaturated C=C bonds) that can react with the reactive species (e.g., nitrenes) that are generated upon exposure to UV to produce crosslinked polymers that are not soluble, dispersed, or substantially swollen in developer solution.

Process For Forming a Photoresist Image

The process for preparing a photoresist image on a substrate comprises, in order:
(X) imagewise exposing the photoresist layer to form imaged and non-imaged areas, wherein the photoresist layer is prepared from a photoresist composition comprising:
(A) at least two polymers selected from the group consisting of (a) to (e); and
(B) a photoactive compound; and
(Y) developing the exposed photoresist layer having imaged and non-imaged areas to form the relief image on the substrate.

Imagewise Exposure

The photoresist layer is prepared by applying a photoresist composition onto a substrate and drying to remove the solvent. The so formed photoresist layer is sensitive in the ultraviolet region of the electromagnetic spectrum and especially to those wavelengths $\leq 365$ nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths, preferably it is done with ultraviolet light of 193 nm, 157 nm, or lower wavelengths, and most preferably, it is done with ultraviolet light of 157 nm or lower wavelengths. Imagewise exposure can either be done digitally with a laser or equivalent device or non-digitally with use of a photomask. Digital imaging with a laser is preferred. Suitable laser devices for digital imaging of the compositions of this invention include, but are not limited to, an argon-fluorine excimer laser with UV output at 193 nm, a krypton-fluorine excimer laser with UV output at 248 nm, and a fluorine ($F_2$) laser with output at 157 nm. Since, as discussed supra, use of UV light of lower wavelength for imagewise exposure corresponds to higher resolution (lower resolution limit), the use of a lower wavelength (e.g., 193 nm or 157 m or lower) is generally preferred over use of a higher wavelength (e.g., 248 nm or higher).

Development

The components in the resist compositions of this invention must contain sufficient functionality for development following imagewise exposure to UV light. Preferably, the functionality is acid or protected acid such that aqueous development is possible using a basic developer such as sodium hydroxide solution, potassium hydroxide solution, or ammonium hydroxide solution.

For example, polymers (c) in the resist compositions of this invention are typically acid-containing materials comprised of at least one fluoroalcohol-containing monomer of structural unit:

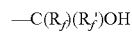

wherein $R_f$ and $R_f'$ are the same or different fluoroalkyl groups of from 1 to 10 carbon atoms or taken together are $(CF_2)_n$ wherein n is 2 to 10. The level of acidic fluoroalcohol groups is determined for a given composition by optimizing the amount needed for good development in aqueous alkaline developer.

When an aqueous processable photoresist is coated or otherwise applied to a substrate and imagewise exposed to UV light, development of the photoresist composition may require that the binder material should contain sufficient acid groups (e.g., fluoroalcohol groups) and/or protected acid groups that are at least partially deprotected upon exposure to render the photoresist (or other photoimageable coating composition) processable in aqueous alkaline developer. In case of a positive-working photoresist layer, the photoresist layer will be removed during development in portions which are exposed to UV radiation but will be substantially unaffected in unexposed portions during development by aqueous alkaline liquids such as wholly aqueous solutions containing 0.262 N tetramethylammonium hydroxide (with development at 25° C. usually for less than or equal to 120 seconds). In case of a negative-working photoresist layer, the photoresist layer will be removed during development in portions which are unexposed to UV radiation but will be substantially unaffected in exposed portions during development using either a critical fluid or an organic solvent.

A critical fluid, as used herein, is one or more substances heated to a temperature near or above its critical temperature and compressed to a pressure near or above its critical pressure. Critical fluids in this invention are at least at a temperature that is higher than 15° C. below the critical temperature of the fluid and are at least at a pressure higher than 5 atmosphers below the critical pressure of the fluid. Carbon dioxide may be used for the critical fluid in the present invention. Various organic solvents can also be used as developer in this invention. These include, but are not limited to, halogenated solvents and non-halogenated solvents. Halogenated solvents are typical and fluorinated solvents are more typical.

Substrate

The substrate employed in this invention can illustratively be silicon, silicon oxide, silicon nitride, or various other materials used in semiconductive manufacture.

EXAMPLES

Glossary
Analytical/Measurements

| | |
|---|---|
| bs | broad singlet |
| δ | NMR chemical shift measured in the indicated solvent |
| g | gram |
| NMR | Nuclear Magnetic Resonance |
| $^1$H NMR | Proton NMR |
| $^{13}$C NMR | Carbon-13 NMR |
| $^{19}$F NMR | Fluorine-19 NMR |
| s | singlet |
| sec. | second(s) |
| m | multiplet |
| mL | milliliter(s) |
| mm | millimeter(s) |
| $T_g$ | Glass Transition Temperature |
| $M_n$ | Number-average molecular weight of a given polymer |
| $M_w$ | Weight-average molecular weight of a given polymer |
| $P = M_w/M_n$ | Polydispersity of a given polymer |
| Absorption coefficient | AC = A/b, where A, absorbance, = $Log_{10}(1/T)$ and b = film thickness in microns, where T = transmittance as defined below. |
| Transmittance | Transmittance, T, = ratio of the radiant power transmitted by a sample to the radiant power incident on the sample and is measured for a specified wavelength (e.g., nm). |

Chemicals/Monomers

| | |
|---|---|
| AA | Acrylic acid<br>Aldrich Chemical Co., Milwaukee, WI |
| AIBN | 2,2'-azobisisobutyronitrile<br>Aldrich Chemical Co., Milwaukee, WI |
| CFC-113 | 1,1,2-Trichlorotrifluoroethane<br>(E. I. du Pont de Nemours and Company, Wilmington, DE) |
| HFIBO | Hexafluoroisobutylene epoxide |
| MEK | 2-Butanone<br>Aldrich Chemical Co., Milwaukee, WI |
| NB | Norbornene = Bicyclo[2.2.1]hept-2-ene<br>Aldrich Chemical Co., Milwaukee, WI |
| Perkadox ® 16 N | Di-(4-tert-butylcyclohexyl)peroxydicarbonate<br>Noury Chemical Corp., Burt, NY |
| PGMEA | Propylene glycol methyl ether acetate<br>Aldrich Chemical Co., Milwaukee, WI |
| tBA | Tertiary-Butyl acrylate |
| TBLC | Tertiary-Butyl Lithocholate |
| TCB | Trichlorobenzene<br>Aldrich Chemical Co., Milwaukee, WI |
| TFE | Tetrafluoroethylene<br>(E. I. du Pont de Nemours and Company, Wilmington, DE) |
| THF | Tetrahydrofuran<br>Aldrich Chemical Co., Milwaukee, WI |
| Vazo ® 52 | 2,4-Dimethyl-2,2'-azobis(pentanenitrile)<br>(E. I. du Pont de Nemours and Company, Wilmington, DE) |

NB-F-O-t-BuAc

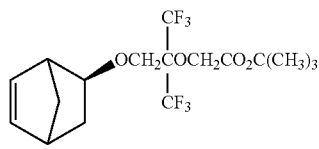

NB-F-O-t-BuAc

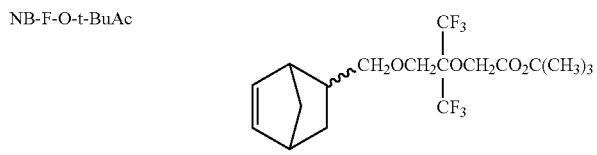

| | |
|---|---|
| NB—Me—OH | X = OH |
| NB—Me—F—OH | X = OCH$_2$C(CF$_3$)$_2$OH |
| NB—Me—F—OMOM | X = OCH$_2$C(CF$_3$)$_2$OCH$_2$OCH$_3$ |

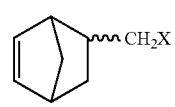

| | |
|---|---|
| NB—OAc | X = OCOCH$_3$ |
| NB—OH | X = OH |
| NB—F—OH | X = OCH$_2$C(CF$_3$)$_2$OH |
| NB—F—OMOM | X = OCH$_2$C(CF$_3$)$_2$OCH$_2$OCH$_3$ |

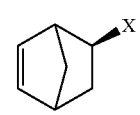

-continued

| | |
|---|---|
| VE—F—OH | CH$_2$ = CHOCH$_2$CH$_2$OCH$_2$C(CF$_3$)$_2$OH |
| VE—F—OMOM | CH$_2$ = CHOCH$_2$CH$_2$OCH$_2$C(CF$_3$)$_2$OCH$_2$OCH$_3$ |

Ultraviolet

| | |
|---|---|
| Extreme UV | Region of the electromagnetic spectrum in the ultraviolet that ranges from 10 nanometers to 200 nanometers |
| Far UV | Region of the electromagnetic spectrum in the ultraviolet that ranges from 200 nanometers to 300 nanometers |
| UV | Ultraviolet region of the electromagnetic spectrum which ranges from 10 nanometers to 390 nanometers |
| Near UV | Region of the electromagnetic spectrum in the ultrviolet that ranges from 300 nanometers to 390 nanometers |

Example 1

Synthesis of a TFE/NB—F—OH/tBA Terpolymer

Synthesis of NB—F—OH was as follows:

A dry round bottom flask equipped with mechanical stirrer, addition funnel and nitrogen inlet was swept with nitrogen and charged with 19.7 g (0,78 mol) of 95% sodium hydride and 500 mL of anhydrous DMF. The stirred mixture was cooled to 5° C. and 80.1 g (0.728 mol) of exo-5-norbornen-2-ol was added dropwise so that the temperature remained below 15° C. The resulting mixture was stirred for ½ hr. HFIBO (131 g, 0.728 mol) was added dropwise at room temperature. The resulting mixture was stirred overnight at room temperature. Methanol (40 mL) was added and most of the DMF was removed on a rotary evaporator under reduced pressure. The residue was treated with 200 mL water and glacial acetic acid was added until the pH was about 8.0. The aqueous mixture was extracted with 3×150 mL ether. The combined ether extracts were washed with 3×150 mL water and 150 mL brine, dried over anhydrous sodium sulfate and concentrated on a rotary evaporator to an oil. Kugelrohr distillation at 0.15–0.20 torr and a pot temperature of 30–60° C. gave 190.1 (90%) of product. $^1$H NMR ($\delta$CD$_2$Cl$_2$) 1.10–1.30 (m, 1H), 1.50 (d, 1H), 1.55–1.65 (m, 1H), 1.70 (s, 1H), 1.75 (d, 1H), 2.70 (s, 1H), 2.85 (s, 1H), 3.90 (d, 1H), 5.95 (s, 1H), 6.25 (s, 1H). Another sample prepared in the same fashion was submitted for elemental analysis. Calcd. for C$_{11}$H$_{12}$F$_6$O$_2$: C, 45.53; H, 4.17; F, 39.28. Found: C, 44.98; H, 4.22; F, 38.25. The synthesis of NB—F—OH is described in PCT Int. Appl. WO 2000067072, published Nov. 9, 2000)

A 200 mL stainless steel autoclave was charged with 48.7 g (0.168 mol) of NB—F—OH, made as described above. 1.54 g (0.012 mol) of tert-butylacrylate (tBA, Aldrich Chemical Company), 75 mL of 1,1,2-trichlorotrifluoroethane and 0.6 g of Perkadox® 16. The vessel was closed, cooled, evacuated and purged with nitrogen several times. It was then charged with 42 g (0.42 mol) of tetrafluoroethylene (TFE). The autoclave was agitated with the vessel contents at 50° C. for about 18 hr resulting in a pressure change from 294 psi to 271 psi. The vessel was cooled to room temperature and vented to one atmosphere. The vessel contents were removed using 1,1,2-trichlorotrifluoroethane to rinse giving a clear solution. This solution was added slowly to excess hexane resulting in precipitation of a white polymer that was dried over night in a vacuum oven. Yield was 11.3 g (12%). GPC analysis: Mn=7300; Mw=10300; Mw/Mn=1.41. DSC analysis: A Tg of 135° C. was observed on second heat. The fluorine NMR spectrum showed peaks at –75.6 ppm (CF$_3$) and –95 to –125 ppm (CF$_2$) confirming incorporation of NB—F—OH and TFE, respectively. The polymer was analyzed by carbon NMR and was found to contain 39 mole % TFE, 42 mole % NB—F—OH and 18 mole % tBA by integration of the appropriate peaks.

Analysis found: C, 43.75; H, 3.92; F, 40.45.

Example 2

Terpolymer of TFE, NB—F—OH and tert-Butyl Acrylate was prepared using the following procedure:

A metal pressure vessel of approximate 270 mL capacity was charged with 71.05 g NB—F—OH, 0.64 g tert-butyl acrylate and 25 mL 1,1,2-trichlorotrifluoroethane. The vessel was closed, cooled to about –15° C. and pressured to 400 psi with nitrogen and vented several times. The reactor was heated to 50° C. and TFE was added until the internal pressure reached 340 psi. A solution of 75.5 g of NB—F—OH and 9.39 g of tert-butyl acrylate diluted to 100 mL with 1,1,2-trichlorotrifluoroethane was pumped into the reactor at a rate of 0.10 mL/min for 12 hr. Simultaneously with the start of the monomer feed solution, a solution of 6.3 g Perkadox®16N and 30–35 mL methyl acetate diluted to 75 mL with 1,1,2-trifluorotrichloroethane was pumped into the reactor at a rate of 2.0 mL/minute for 6 minutes, and then at a rate of 0.08 mL/minute for 8 hours. The internal pressure was maintained at 340 psi by addition of TFE as required. After a 16 hours reaction time, the vessel was cooled to room temperature and vented to 1 atmosphere. The recovered polymer solution was added slowly to an excess of hexane while stirring. The precipitate was filtered, washed with hexane and dried in a vacuum oven. The resulting solid was dissolved in a mixture of THF and 1,1,2-trichloro-trifluoroethane and added slowly to excess to hexane. The precipitate was filtered, washed with hexane and dried in a vacuum oven overnight to give 47.5 g of white polymer. From its $^{13}$C NMR spectrum, the polymer composition was found to be 35% TFE, 42% NB—F—OH and 22% tBA. DSC: Tg=151° C. GPC: Mn=6200; Mw=9300; Mw/Mn=1.50. Anal. Found: C, 44.71; H, 4.01; F, 39.38.

Example 3

The homopolymer of NB-Me-F—OH was prepared using the following procedure:

Under nitrogen, 0.19 g (0.49 mmol) of the allyl palladium complex [($\eta^3$-MeCHCHCH$_2$)PdCl]$_2$ and 0.34 g (0.98 mmol) silver hexafluoroantimonate were suspended in chlorobenzene (40 mL). The resulting mixture was stirred at room temperature for 30 minutes. It was then filtered to remove precipitated AgCl, and an additional 10 mL chlorobenzene added. The resulting solution was added to 15.0 g (49.0 mmol) of NB—Me—F—OH. The resulting reaction mixture was stirred for three days at room temperature. The crude product polymer was isolated by precipitation in hexane. This material was taken up in acetone to give a 10 weight % solution, and filtered through a 0.2 μm Teflon® filter; the acetone filtrate was then concentrated to dryness, affording 7.8 g of addition copolymer. GPC: $M_n$=6387; $M_w$=9104; $M_w/M_n$=1.43. Anal. Found: C, 46.28; H, 4.81; F, 34.22. $^1$H NMR (CD$_2$Cl$_2$) of the polymer was consistent with the saturated vinyl-addition polymer shown below:

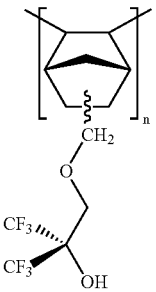

Example 4

NB—F—OH/NB—F—O-t-BuAc Copolymer was synthesized by Polymer Modification using the following procedure:

A 500 mL round bottom flask with mechanical stirrer, addition funnel and reflux condenser was charged with 53.6 g of a NB—F—OH vinyl addition homopolymer which was calculated to contain 0.185 mol of hexafluoroisopropanol groups, 200 mL of acetonitrile and 30.6 g (0.222 mol) of potassium carbonate. This mixture was refluxed for 0.5 hr. tert-Butyl bromoacetate (10.8 g, 0.055 mol) was added dropwise and the resulting mixture was refluxed for 3 hr. The mixture was cooled to room temperature and diluted by addition of 300 mL acetone. The mixture was then filtered and concentrated under vacuum to a volume of approximately 200 mL. The concentrated mixture was slowly poured into 5.4 L 1.0% aqueous HCl. The resulting precipitate was filtered and washed with water. The precipitate was then dissolved in 200 mL acetone; to this solution was added a solution of 5 mL water and 3 mL 36% aqueous HCl. The resulting solution was slightly cloudy. It was poured into 5.4 L of water. The precipitate was washed with water several times and dried to afford 44.0 g of NB—F—OH/NB—F—O-t-BuAc copolymer. $^{19}$F NMR (∂ acetone-d$_6$)−73.1 (s, assigned to units from the NB—F—O-t-BuAc), −75.4 (s, assigned to units from NB—F—OH) By integration of the spectrum, the composition of the polymer was found to 64% NB—F—OH and 36% NB—F—O-t-BuAc. Samples of the polymer were spin coated from a 5% solution in 2-heptanone. The absorption coefficient at 157 nm was determined to be 3.15 μm$^{-1}$ at a film thickness of 47.2 nm and 2.70 μm$^{-1}$ at a film thickness of 45.7 nm.

Example 5

NB—Me—F—OH/NB—Me—F—O-t-BuAc Copolymer was synthesized by Polymer Modification using the following procedure:

Example 4 was repeated with the following exception: a NB-Me-F—OH vinyl addition homopolymer was used instead of NB—F—OH vinyl addition homopolymer, to synthesize a NB—Me—F—OH/NB—Me—F—O-t-BuAc copolymer. $^{19}$F NMR (∂, acetone-d$_6$) −73.2 (s, assigned to units from the NB—Me—F—O-t-BuAc), −75.3 (s, assigned to units from NB—Me—F—OH). By integration of the spectrum, the composition of the polymer was found to 68% NB-Me-F—OH and 32% NB-Me-F—O-t-BuAc.

Example 6

The following formulation, with 3/1 polymer blend, was prepared and magnetically stirred:

| Component | Wt. (gm) |
|---|---|
| TFE/NB—F—OH/tBA copolymer (35/42/22, as analyzed by $^{13}$C NMR), prepared in a manner similar to that as described in Example 2 | 0.390 |
| NB—Me—F—OH/NB—Me—F—O—Ac-tBu copolymer (68/32, as analyzed by $^{19}$F NMR) similar to that described in Example 5 | 0.130 |
| 2-Heptanone | 5.121 |
| Tertiary-Butyl Lithocholate | 0.060 |
| 6.82% (wt) solution of triphenylsulfonium nonaflate dissolved in 2-heptanone which had been filtered through a 0.45μ PTFE syringe filter. | 0.299 |

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 5 mL of hexamethyldisilazane (HMDS) primer and spinning at 5000 rpm for 10 sec. Then 1–3 mL of the above solution, after filtering through a 0.45 μm PTFE syringe filter, was deposited and spun at 2500 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 5 seconds, providing an unattenuated dose of 7.5 mJ/cm$^2$. By using a mask with 18 positions of varying neutral optical density, a wide variety of exposure doses were generated. After exposure, the exposed wafer was baked at 100° C. for 60 seconds. The wafer was developed in aqueous tetramethylammonium hydroxide (TMAH) solution (Shipley LDD-26W developer, 0.26N TMAH solution) for 60 seconds, providing a positive image pattern.

Example 7

The following formulation, with 1/1 polymer blend, was prepared and magnetically stirred:

| Component | Wt. (gm) |
|---|---|
| TFE/NB—F—OH/tBA copolymer (35/42/22, as analyzed by $^{13}$C NMR), prepared in a manner similar to that as described in Example 2 | 0.260 |
| NB—Me—F—OH/NB—Me—F—O—Ac-tBu copolymer (68/32, as analyzed by $^{19}$F NMR) similar to that described in Example 5 | 0.260 |
| 2-Heptanone | 5.121 |

-continued

| Component | Wt. (gm) |
|---|---|
| Tertiary-Butyl Lithocholate | 0.060 |
| 6.82% (wt) solution of triphenylsulfonium nonaflate dissolved in 2-heptanone which had been filtered through a 0.45μ PTFE syringe filter. | 0.299 |

Processing was performed as in Example 6, except that exposure was for 10 seconds, providing an unattenuated dose of 15 mJ/cm². A positive image pattern was obtained.

Example 8

The following formulation, with 1/3 polymer blend, was prepared and magnetically stirred:

| Component | Wt. (gm) |
|---|---|
| TFE/NB—F—OH/tBA copolymer (35/42/22, as analyzed by ¹³C NMR), prepared in a manner similar to that as described in Example 2 | 0.130 |
| NB—Me—F—OH/NB—Me—F—O—Ac-tBu copolymer (68/32, as analyzed by ¹⁹F NMR) similar to that described in Example 5 | 0.390 |
| 2-Heptanone | 5.121 |
| Tertiary-Butyl Lithocholate | 0.060 |
| 6.82% (wt) solution of triphenylsulfonium nonaflate dissolved in 2-heptanone which had been filtered through a 0.45μ PTFE syringe filter. | 0.299 |

Processing was performed as in Example 6, except that exposure was for 10 seconds, providing an unattenuated dose of 15 mJ/cm². A positive image pattern was obtained.

What is claimed is:

1. A photoresist composition comprising:
 (A) at least two polymers selected from the group consisting of:
  (a) a fluorine-containing copolymer comprising a repeat unit derived from at least one ethylenically unsaturated compound characterized in that the at least one ethylenically unsaturated compound is polycyclic;
  (b) a branched polymer containing protected acid groups, said polymer comprising one or more branch segment(s) chemically linked along a linear backbone segment;
  (c) a fluoropolymer having at least one fluoroalcohol group having the structure:

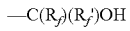

wherein $R_f$ and $R_f'$ are the same or different fluoroalkyl groups of from 1 to about 10 carbon atoms or taken together are $(CF_2)_n$ wherein n is 2 to about 10; and
  a nitrile/fluoroalcohol-containing polymer prepared from substituted or unsubstituted vinyl ethers; and
 (B) at least one photoactive component.

2. The photoresist composition of claim 1 wherein the absorption coefficient of the polymers is less than about 5.0 μm⁻¹ at a wavelength of about 157 nm.

3. The photoresist composition of claim 1 wherein the absorption coefficient of the polymers is less than about 4.0 μm⁻¹ at a wavelength of about 157 nm.

4. The photoresist composition of claim 1 wherein the absorption coefficient of the polymers is less than about 3.5 μm⁻¹ at a wavelength of about 157 nm.

5. The photoresist composition of claim 1 wherein the polymer (a) is a fluorine-containing copolymer comprising a repeat unit derived from at least one ethylenically unsaturated compound characterized in that at least one ethylenically unsaturated compound is polycyclic and at least one ethylenically unsaturated compound contains at least one fluorine atom covalently attached to an ethylenically unsaturated carbon atom.

6. The photoresist composition of claim 1 wherein the polymer (a) is a fluorine-containing copolymer comprising a repeat unit derived from at least one polycyclic ethylenically unsaturated compound having at least one atom or group selected from the group consisting of fluorine atom, perfluoroalkyl group, and perfluoroalkoxy group, characterized in that the at least one atom or group is covalently attached to a carbon atom which is contained within a ring structure and separated from each ethylenically unsaturated carbon atom of the ethylenically unsaturated compound by at least one covalently attached carbon atom.

7. The photoresist composition of claim 1 wherein the polymer (b) is a branched polymer containing protected acid groups, said polymer comprising one or more branch segment(s) chemically linked along a linear backbone segment.

8. The photoresist composition of claim 1 wherein the polymer (c) is selected from the group consisting of:
 (c1) a fluorine-containing polymer comprising a repeat unit derived from at least one ethylenically unsaturated compound containing a fluoroalcohol functional group having the structure:

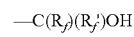

wherein $R_f$ and $R_f'$ are the same or different fluoroalkyl groups of from 1 to about 10 carbon atoms or taken together are $(CF_2)_n$ wherein n is 2 to about 10;
 (c2) a fluorine-containing copolymer comprising a repeat unit derived from at least one ethylenically unsaturated compound characterized in that at least one ethylenically unsaturated compound is cyclic or polycyclic, at least one ethylenically unsaturated compound contains at least one fluorine atom covalently attached to an ethylenically unsaturated carbon atom, and at least one ethylenically unsaturated compound is comprised of a fluoroalcohol functional group having the structure:

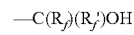

wherein $R_f$ and $R_f'$ are the same or different fluoroalkyl groups of from 1 to about 10 carbon atoms or taken together are $(CF_2)_n$ wherein n is 2 to 10;
 (c3) a fluorine-containing copolymer comprising:
  (i) a repeat unit derived from at least one ethylenically unsaturated compound containing at least three fluorine atoms covalently attached to two ethylenically unsaturated carbon atoms; and
  (ii) a repeat unit derived from an ethylenically unsaturated compound comprised of a fluoroalcohol functional group having the structure:

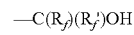

wherein $R_f$ and $R_f'$ are the same or different fluoroalkyl groups of from 1 to about 10 carbon atoms or taken together are $(CF_2)_n$ wherein n is 2 to 10;

(c4) a fluorine-containing copolymer comprising a repeat unit derived from at least one ethylenically unsaturated compound containing a fluoroalcohol functional group having the structure:

—ZCH₂C(R_f)(R_f')OH wherein $R_f$ and $R_f'$ are the same or different fluoroalkyl groups of from 1 to about 10 carbon atoms or taken together are $(CF_2)_n$ wherein n is 2 to 10; and Z is an element from Group VA or Group VIA of the Periodic Table of the Elements;

(c5) a fluorine-containing polymer comprising the structure:

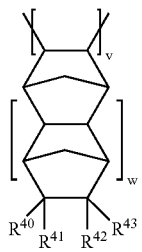

wherein each of $R^{40}$, $R^{41}$, $R^{42}$, and $R^{43}$ independently is a hydrogen atom, a halogen atom, a hydrocarbon group containing from 1 to 10 carbon atoms, a substituted hydrocarbon group, an alkoxy group, a carboxylic acid, a carboxylic ester or a functional group containing the structure:

—C(R_f)(R_f')OR⁴⁴ wherein $R_f$ and $R_f'$ are the same or different fluoroalkyl groups of from 1 to 10 carbon atoms or taken together are $(CF_2)_n$ wherein n is 2 to 10; $R^{44}$ is a hydrogen atom or an acid- or base-labile protecting group; v is the number of repeat units in the polymer; w is 0–4; at least one of the repeat units has a structure whereby at least one of $R^{40}$, $R^{41}$, $R^{42}$, and $R^{43}$ contains the structure $C(R_f)(R_f')OR^{44}$; and (c6) a polymer comprising:
(i) a repeat unit derived from at least one ethylenically unsaturated compound containing a fluoroalcohol functional group having the structure:

—C(R_f)(R_f')OH wherein $R_f$ and $R^{fi}$ are the same or different fluoroalkyl groups of from 1 to about 10 carbon atoms or taken together are $(CF_2)_n$ wherein n is 2 to about 10; and (ii) a repeat unit derived from at least one ethylenically unsaturated compound having the structure:

(H)(R⁴⁵)C=C(R⁴⁶)(CN)

wherein $R^{45}$ is a hydrogen atom or CN group; $R^{46}$ is $C_1$–$C_8$ alkyl group, hydrogen atom, or $CO_2R^{47}$ group, where $R^{47}$ is $C_1$–$C_8$ alkyl group or hydrogen atom.

9. The photoresist composition of claim 8 wherein the polymer (c) further comprises a spacer group selected from the group consisting of ethylene, alpha-olefins, 1,1'-disubstituted olefins, vinyl alcohols, vinyl ethers, and 1,3-dienes.

10. The photoresist composition of claim 1 wherein the polymer (d) further comprises one or more comonomers $CR^{51}R^{52}$=$CR^{53}R^{54}$ where each of $R^{51}$, $R^{52}$, and $R^{53}$ is selected independently from H or F and where $R^{54}$ is selected from the group consisting of —F, —$CF_3$, —$OR^{55}$ where $R^{55}$ is $C_nF_{2n+1}$ with n=1 to 3, —OH (when $R^{53}$=H), and Cl (when $R^{51}$, $R^{52}$, and $R^{53}$=F).

11. The photoresist composition of claim 1 wherein the polymer (d) is selected from the group consisting of
(d1) a polymer comprising:
(i) a repeat unit derived from at least one ethylenically unsaturated compound comprising a vinyl ether functional group and having the structure:

CH₂=CHO—R⁵⁶ where $R^{56}$ is a substituted or unsubstituted alkyl, aryl, aralkyl, or alkaryl group of from 1 to about 20 carbon atoms; and (ii) a repeat unit derived from at least one ethylenically unsaturated compound having the structure:

(H)(R⁵⁷)C=C(R⁵⁸)(CN)

wherein $R^{57}$ is a hydrogen atom or cyano group; $R^{58}$ is an alkyl group ranging from 1 to about 8 carbon atoms, $CO_2R^{59}$ group wherein $R^{59}$ is an alkyl group ranging from 1 to about 8 carbon atoms, or hydrogen atom; and (iii) a repeat unit derived from at least one ethylenically unsaturated compound comprising an acidic group; and (d2) a polymer comprising:
(i) a repeat unit derived from at least one ethylenically unsaturated compound comprising a vinyl ether functional group and a fluoroalcohol functional group and having the structure:

C(R⁶⁰)(R⁶¹)=C(R⁶²)-O-D-C(R_f)(R_f')OH wherein $R^{60}$, $R^{61}$, and $R^{62}$ independently are hydrogen atom, alkyl group ranging from 1 to about 3 carbon atoms; D is at least one atom that links the vinyl ether functional group through an oxygen atom to a carbon atom of the fluoroalcohol functional group; $R_f$ and $R_f'$ are the same or different fluoroalkyl groups containing from 1 to about 10 carbon atoms or taken together are $(CF_2)_n$ wherein n an integer ranging from 2 to about 10; and (ii) a repeat unit derived from at least one ethylenically unsaturated compound having the structure:

(H)(R⁵⁷)C=C(R⁵⁸)(CN)

wherein $R^{57}$ is a hydrogen atom or cyano group; $R^{58}$ is an alkyl group ranging from 1 to about 8 carbon atoms, $CO_2R^{59}$ group wherein $R^{59}$ is an alkyl group ranging from 1 to about 8 carbon atoms, or hydrogen atom; and (iii) a repeat unit derived from at least one ethylenically unsaturated compound comprising an acidic group.

12. The photoresist composition of claim 1 wherein the photoactive component is chemically bonded to the polymer selected from the group consisting of (a) to (d).

13. A process for preparing a photoresist image on a substrate comprising, in order:
(X) imagewise exposing the photoresist layer to form imaged and non-imaged areas, wherein the photoresist layer is prepared from a photoresist composition comprising:
(A) at least two polymers selected from the group consisting of
(a) a fluorine-containing copolymer comprising a repeat unit derived from at least one ethylenically unsaturated compound characterized in that the at least one ethylenically unsaturated compound is polycyclic;

(b) a branched polymer containing protected acid groups, said polymer comprising one or more branch segment(s) chemically linked along a linear backbone segment;

(c) a fluoropolymer having at least one fluoroalcohol group having the structure:

—C($R_f$)($R_f'$)OH wherein $R_f$ and $R_f'$ are the same or different fluoroalkyl groups of from 1 to about 10 carbon atoms or taken together are $(CF_2)_n$ wherein n is 2 to about 10; and nitrile/fluoroalcohol-containing polymers prepared from substituted or unsubstituted vinyl ethers; and (B) a photoactive component; and (Y) developing the exposed photoresist layer having imaged and non-imaged areas to form the relief image on the substrate.

14. The process of claim 13 wherein the absorption coefficient of the polymers is less than about 5.0 $\mu m^{-1}$ at a wavelength of about 157 nm.

15. The process of claim 13 wherein the absorption coefficient of the polymers is less than about 4.0 $\mu m^{-1}$ at a wavelength of about 157 nm.

16. The process of claim 13 wherein the absorption coefficient of the polymers is less than about 3.5 $\mu m^{-1}$ at a wavelength of about 157 nm.

* * * * *

UNITED STATES PATENT AND TRADEMARK OFFICE
CERTIFICATE OF CORRECTION

PATENT NO. : 7,045,268 B2
APPLICATION NO. : 10/398871
DATED : May 16, 2006
INVENTOR(S) : Larry L. Berger and Frank Leonard Schadt, III It is certified that error appears in the above-identified patent and that said Letters Patent is hereby corrected as shown below:

On Title Page item 57
Abstract

Lines 10-11, "—C(Rf)(Rf')OH wherein Rf and Rf' are the same" should read
-- —C($R_f$)($R_{f'}$)OH wherein $R_f$ and $R_{f'}$ are the same --.

Line 12, "(CF2)n" should read -- $(CF_2)_n$ --.

Line 14, "CX2=CY2" should read -- $CX_2=CY_2$ --.

Line 15, "CF3" should read -- $CF_3$ --.

Line 16, "CX2=CY2" should read -- $CX_2=CY_2$ --.

Background of the Invention

Column 1, line 35, "Theological" should read -- rheological --.

Column 1, line 67, "cycloolefinmaleic" should read -- cycloolefin-maleic --.

Column 2, line 17, "flourinated" should read -- fluorinated --.

Column 2, line 18, "etylenically" should read -- ethylenically --.

Summary

Column 3, line 38, "polymer" should read -- polymers --.

Detailed Description

Column 3, line 64, "particularly" should read -- particular --.

Column 4, line 32, "may selected" should read -- may be selected --.

Column 9, line 48, "(This" should read -- This --.

UNITED STATES PATENT AND TRADEMARK OFFICE
CERTIFICATE OF CORRECTION

PATENT NO. : 7,045,268 B2
APPLICATION NO. : 10/398871
DATED : May 16, 2006
INVENTOR(S) : Larry L. Berger and Frank Leonard Schadt, III It is certified that error appears in the above-identified patent and that said Letters Patent is hereby corrected as shown below:

Detailed Description (cont'd)

Column 13, line 3, "componert" should read -- component --.

Column 13, line 48, "iminobydroxyimino" should read -- iminohydroxyimino --.

Column 13, line 50, "diazadihydroxyimino-dialkylun-" should read

-- diazadihydroxyiminodialkylun- --

Column 13, line 52, "raazatetraalkylcyclotedodecatetraene" should read

-- raazatetraalkylcyclododecatetraene --.

Column 14, line 59, "{IA]" should read -- [IA] --.

Column 15, line 54, "—N+R$^{36}$R$^{37}$R$^{38}$" should read -- —N$^+$R$^{36}$R$^{37}$R$^{38}$ --.

Column 15, line 58, "—COON" should read -- —COOH --.

Column 17, line 40, "hydroxylproton" should read -- hydroxyl proton --.

Coumn 18, lines 27-28, "CH$_2$=CHOCH$_2$OCH$_2$C(CF$_3$)$_2$OH CH$_2$=CHO (CH$_2$)$_4$OCH$_2$C(CF$_3$)$_2$OH" should read

-- CH$_2$=CHOCH$_2$CH$_2$OCH$_2$C(CF$_3$)$_2$OH

CH$_2$=CHO(CH$_2$)$_4$OCH$_2$C(CF$_3$)$_2$OH --.

Column 18, line 33, "compound having" should read -- compounds having --.

Column 20, line 58,

Should read

UNITED STATES PATENT AND TRADEMARK OFFICE
CERTIFICATE OF CORRECTION

PATENT NO. : 7,045,268 B2
APPLICATION NO. : 10/398871
DATED : May 16, 2006
INVENTOR(S) : Larry L. Berger and Frank Leonard Schadt, III It is certified that error appears in the above-identified patent and that said Letters Patent is hereby corrected as shown below:

Detailed Description (cont'd)

Column 22, line 53, "CnF2n+1" should read -- $C_nF_{2n+1}$ --.

Column 22, line 60, "dimethyl-1,3 -dioxole" should read -- dimethyl-1,3-dioxole --.

Column 23, lines 3-4, "$CF_3CF_2CF_2OCF(CF_3)(C=O)OO(C=O)CF(CF_3)$ $OCF_2CF_2CF_3$" should read

-- $CF_3CF_2CF_2OCF(CF_3)(C=O)OO(C=O)CF(CF_3)OCF_2CF_2CF_3$ --.

Column 24, lines 18-19, "$CH_2=CHOCH_2OCH_2C(CF_3)_2OH$ $CH_2=CHO$ $(CH_2)_4OCH_2C(CF_3)_2OH$" should read

-- $CH_2=CHOCH_2CH_2OCH_2C(CF_3)_2OH$ $CH_2=CHO(CH_2)_4OCH_2C(CF_3)_2OH$ --.

Column 25, line 2, "(e.g., $C_{10}H_{21}O$" with -- (e.g., $C_{10}H_{21}O$) --.

Column 25, line 24, "as,4,4'-diazidodiphenyl" should read -- as 4,4'-diazidodiphenyl --.

Column 26, line 19, "ultrviolet" should read -- ultraviolet --.

Column 26, line 30, "(0,78 mol)" should read -- (0.78 mol) --.

Examples

Column 22, line 24, "0.45µ" should read -- 0.45µm --.

Column 33, line 8, "0.45µ" should read -- 0.45µm --.

Column 33, line 32, "0.45µ" should read -- 0.45µm --.

UNITED STATES PATENT AND TRADEMARK OFFICE
CERTIFICATE OF CORRECTION

PATENT NO. : 7,045,268 B2
APPLICATION NO. : 10/398871
DATED : May 16, 2006
INVENTOR(S) : Larry L. Berger and Frank Leonard Schadt, III It is certified that error appears in the above-identified patent and that said Letters Patent is hereby corrected as shown below:

Claims

Column 33, line 59, "a nitrile/fluoroalcohol-containing" should read -- (d) a nitrile/fluoroalcohol-containing --.

Column 34, line 53, "2to 10" should read -- 2 to 10 --.

Column 35, line 49, "$R^{f'}$ are" should read -- $R_{f'}$ --.

Column 36, line 42, "n an integer" should read -- n is an integer --.

Column 37, line 16, "nitrile/fluoroalchohol-containing" should read -- (d) a nitrile/fluoroalcohol-containing --.

Signed and Sealed this

Twenty-seventh Day of March, 2007

JON W. DUDAS
*Director of the United States Patent and Trademark Office*